(12) United States Patent
Beck et al.

(10) Patent No.: US 6,518,086 B2
(45) Date of Patent: Feb. 11, 2003

(54) PROCESSING APPROACH TOWARDS THE FORMATION OF THIN-FILM CU(IN,GA)SE$_2$

(75) Inventors: Markus E. Beck, Falkensee (DE); Rommel Noufi, Golden, CO (US)

(73) Assignee: Midwest Research Institute, Kansas City, MO (US)

( * ) Notice: Subject to any disclaimer, the term of this patent is extended or adjusted under 35 U.S.C. 154(b) by 0 days.

(21) Appl. No.: 10/026,506

(22) Filed: Dec. 18, 2001

(65) Prior Publication Data

US 2002/0106873 A1 Aug. 8, 2002

Related U.S. Application Data

(63) Continuation of application No. 09/442,196, filed on Nov. 16, 1999.

(51) Int. Cl.$^7$ ................................................ H01L 21/00
(52) U.S. Cl. ....................... 438/95; 136/264; 136/265; 438/96; 438/930
(58) Field of Search ................................ 136/260, 264, 136/265; 204/192.25, 192.26, 298.13, 298.19, 298.23, 298.25, 298.26; 438/95, 96, 930

(56) References Cited

U.S. PATENT DOCUMENTS

| | | | |
|---|---|---|---|
| 4,465,575 A | 8/1984 | Love et al. | 204/192 |
| 4,581,108 A | 4/1986 | Kapur et al. | 204/37.1 |
| 4,915,745 A | 4/1990 | Pollock et al. | 136/265 |
| 5,078,804 A | 1/1992 | Chen et al. | 136/260 |
| 5,356,839 A | 10/1994 | Tuttle et al. | 437/225 |
| 5,436,204 A | 7/1995 | Albin et al. | 437/225 |
| 5,441,897 A | 8/1995 | Noufi et al. | 437/5 |
| 5,674,555 A | 10/1997 | Birkmire et al. | 427/76 |
| 5,728,231 A | 3/1998 | Negami et al. | 148/33 |
| 5,730,852 A | 3/1998 | Bhattacharya et al. | 205/192 |
| 5,731,031 A | 3/1998 | Bhattacharya et al. | 427/76 |

*Primary Examiner*—Michael Sherry
*Assistant Examiner*—Asok Kumar Sarkar
(74) *Attorney, Agent, or Firm*—Paul J. White

(57) ABSTRACT

A two-stage method of producing thin-films of group IB-IIIA-VIA on a substrate for semiconductor device applications includes a first stage of depositing an amorphous group IB-IIIA-VIA precursor onto an unheated substrate, wherein the precursor contains all of the group IB and group IIIA constituents of the semiconductor thin-film to be produced in the stoichiometric amounts desired for the final product, and a second stage which involves subjecting the precursor to a short thermal treatment at 420° C.–550° C. in a vacuum or under an inert atmosphere to produce a single-phase, group IB-III-VIA film. Preferably the precursor also comprises the group VIA element in the stoichiometric amount desired for the final semiconductor thin-film. The group IB-IIIA-VIA semiconductor films may be, for example, Cu(In,Ga)(Se,S)$_2$ mixed-metal chalcogenides. The resultant supported group IB-IIIA-VIA semiconductor film is suitable for use in photovoltaic applications.

29 Claims, 15 Drawing Sheets

PROCESSING APPROACH TOWARDS THE FORMATION OF THIN-FILM CU(IN,GA)SE$_2$

CROSS REFERENCE TO RELATED PATENT APPLICATION

This patent application is a continuation of patent application Ser. No. 09/442,196, filed in the U.S. Patent and Trademark Office on Nov. 16, 1999.

CONTRACTUAL ORIGIN OF THE INVENTION

The United States Government has rights in this invention under Contract No. DE-AC36-83CH10093 between the U.S. Department of Energy and the National Renewable Energy Laboratory, a Division of Midwest Research Institute.

BACKGROUND OF THE INVENTION

1. Field of the Invention

The present invention is related generally to preparation of thin-film compounds and more particularly to preparing thin-film compounds of $Cu(In,Ga)(Se,S)_2$ in semiconductor devices.

2. Description of the Prior Art

Semiconductor alloy films of group IB-IIIA-VIA elements are the subject of considerable interest in the semiconductor field, particularly as to their utility as absorber layers in photovoltaic devices, such as solar cells. Photovoltaic devices (solar cells) utilize the specific electronic properties of semiconductors to convert the visible and near visible light energy of the sun into usable electrical energy. This conversion results from the absorption of radiant energy in the semiconductor materials, which frees some valence electrons, thereby generating electron-hole pairs. The energy required to generate electron-hole pairs in a semiconductor material is referred to as the band gap energy, which in general is the minimum energy needed to excite an electron from the valence band to the conduction band.

Semiconductor materials comprised of group IB and group IIIA metals and group VIA elements (commonly referred to as metal chalcogenides, or group IB-IIIA-VIA semiconductor thin-films) are important candidate materials for photovoltaic applications, since many of these semiconductor materials have optical band gap values well within the terrestrial solar spectrum. Mixed-metal chalcogenide semiconductors, such as copper-indium-diselenide ($CuInSe_2$), copper-gallium-diselenide ($CuGaSe_2$), and copper-indium-gallium-diselenide ($CuIn_{1-X}Ga_X Se_2$), all of which are sometimes generically referred to as $Cu(In,Ga)Se_2$, or CI(G)S, have become the subject of considerable interest and study for semiconductor devices in recent years because of their high solar energy to electrical energy conversion efficiencies. Sulphur can also be, and sometimes is, substituted for selenium, so the CI(G)S is sometimes also referred to even more generically as $Cu(In,Ga)(Se,S)_2$ to comprise all of those possible combinations. The electrical energy conversion efficiencies of CI(G)S semiconductor materials have been shown to exceed nineteen percent (19%) in active areas and to approach nineteen percent (19%) in total areas, which is quite high for current state-of-the-art solar cell technologies. See Contreras, M. et al., *Progress in Photovoltaics* (1999) 7:311–316. It has been generally believed by persons skilled in this art that the best electronic device properties, thus the best conversion efficiencies, are obtained when the $Cu(In,Ga)Se_2$ compound or alloy is slightly Cu-poor.

While the growth of single crystal $CuInSe_2$ has been studied, such as in U.S. Pat. No. 4,652,332, issued to T. Ciszek, the use of polycrystalline thin-films is really more practical. Sputter depositing a ternary single phase $CuInSe_2$ layer, including the ability to determine the properties of the thin-film, such as multilayered structures, by varying the sputter process parameters, is described in U.S. Pat. No. 4,818,357, issued to Case et al.

Currently, the two fabrication methods of choice for the production of CI(G)S compounds are: (1) direct compound formation, such as physical vapor deposition of the constituent elements, exemplified by the process disclosed in U.S. Pat. No. 5,141,564, issued to Chen et al., which is generally used as a research tool, and (2) two-stage processes via various precursor structures, for example, the selenization of Cu/In metal precursors by either $H_2Se$ gas or Se vapor. The selenization technology generally exemplified by the processes described in U.S. Pat. No. 4,798,660, issued to Ermer et al., U.S. Pat. No. 4,915,745, issued to Pollock et al., and U.S. Pat. No. 5,045,409, issued to Eberspacher et al., is currently favored for manufacturing processes.

A general disadvantage of more of the direct absorber formation processes is the fact that high substrate temperatures (i.e., 300 to 550° C.) need to be maintained during film growth for times exceeding 25 minutes. Although such substrate temperatures are acceptable on a laboratory scale, they are less desirable for industrial scale productions due to the high thermal budget. Most of the indirect two-stage processes address this problem by employing deposition of elemental copper, gallium, and indium onto unheated substrates followed by thermal treatment in the presence of selenium. However, most of these two-stage processes suffer from several drawbacks, such as requiring the use of highly toxic $H_2Se$, which also has the drawback of resulting in low Se utilization, or poor film adhesion to Mo-coated substrates due to large volume expansion upon selenization of the dense elemental layer structures.

U.S. Pat. No. 5,356,839, issued to Tuttle et al., U.S. Pat. No. 5,441,897, issued to Noufi et al., and U.S. Pat. No. 5,436,204, issued to Albin et al. describe methods for producing high quality $Cu(In,Ga)(Se,S)_2$ thin-films using vapor-phase recrystallization techniques. The fabrication processes described in these patents, each of which is assigned to the assignee of the present application, provide improved performance and yield as well as more reproducible, consistent quality than prior methods. For example, U.S. Pat. No. 5,356,839 describes a process for fabricating $Cu_w(In,Ga_y)Se_z$ films by initially forming a Cu-rich, phase separated, compound mixture comprising $Cu(In,Ga):Cu_xSe$ on a substrate, then converting the excess $Cu_xSe$ to $Cu(In,Ga)Se_2$ by exposing it to an activity of In and/or Ga, either in vapor form or in solid $(In,Ga_y)Se_z$ form. The characteristic of the resulting $Cu_w(In,Ga_y)Se_z$ was controlled by the temperature. Higher temperatures, such as 500°–600° C., resulted in a nearly stoichiometric $Cu(In,Ga)Se_2$, whereas lower temperatures, such as 300°–400° C., resulted in a more Cu-poor compound, such as the $Cu_z(In,Ga)_4Se_7$ phase. U.S. Pat. Nos. 5,441,897 and 5,436,204 describe further modifications of the recrystallization process.

While the above-described metal chalcogenide semiconductor films provide relatively high conversion efficiencies, commercial use of these films is problematic for several reasons. Films produced by these selenization processes usually suffer from macroscopic spatial nonuniformities that degrade performance and yield, and reproducible consistent quality from run to run is unpredictable and difficult to obtain. Also, some of the key constituents of mixed-metal chalcogenide materials, such as indium and gallium, are very expensive, and current processes are somewhat wasteful of these materials. Finally, those processes in which precursors are deposited on heated substrates and subsequently are further heated to produce the mixed-metal chalcogenide film require a high thermal budget. Therefore, working with $Cu(In,Ga)(Se,S)_2$ material has still been difficult, particularly when scaling up for industrial applications.

A need therefore exists for a fabrication process that produces a better quality, mixed-metal chalcogenide film more consistently and more predictably than previously known processes, and with more efficient and cost effective utilization of materials.

SUMMARY OF THE INVENTION

Accordingly, it is a general object of this invention to provide a novel, two-stage process for the production of monophasic group IIB-IIIA-VIA alloy semiconductor films.

It is a more specific object of this invention to provide a two-stage process that produces a device-quality $Cu(In,Ga)(Se,S)_2$ more consistently and more predictably than previously known processes.

It is also an object of this invention to provide a process capable of fabricating high-quality films of $Cu(In,Ga)(Se,S)_2$ with more efficient and cost effective utilization of materials.

It is another object of this invention to provide a method of producing $Cu(In,Ga)(Se,S)_2$ precursors having approximately the same stoichiometry as the $Cu(In,Ga)(Se,S)_2$ alloy produced by such precursors.

It is still another object of this invention to provide a process for producing $Cu(In,Ga)(Se,S)_2$ thin-films wherein the process does not require an excess of any of the constituents of the thin-film or extensive heating times during processing, and thus can be scaled up easily to production of large areas and commercial quantities.

Additional objects, advantages, and novel features of the present invention will be set forth in part in the description that follows, and in part will become apparent to those skilled in the art upon examination of the following description and drawings, or may be learned by the practice of the invention, or may be realized and attained by means of the instrumentalities and in combinations particularly pointed out in the appended claims.

To achieve the foregoing and other objects, and in accordance with the purposes of the present invention as embodied and broadly described herein, the two-stage method of this invention may comprise a first stage of depositing an amorphous group IB-IIIA-VIA precursor onto an unheated substrate, wherein the precursor comprises all of the group IB and group IIIA constituents of the semiconductor thin-film to be produced in the stoichiometric amounts desired for the final product, and subjecting the precursor to a short thermal treatment under an inert atmosphere to produce a single-phase, group IB-IIIA-VIA film. Preferably the precursor also comprises the group VIA element in the stoichiometric amount desired for the final semiconductor thin-film. The group IB-IIIA-VIA semiconductor films may be, for example, $Cu(In,Ga)(Se,S)_2$ mixed-metal chalcogenides. The resultant substrate-supported group IB-IIIA-VIA semiconductor film is suitable for use in photovoltaic applications.

BRIEF DESCRIPTION OF THE DRAWINGS

The accompanying drawings, which are incorporated in and form part of the specification, illustrate the preferred embodiments of the present invention, and together with the descriptions serve to explain the principles of the invention. In the Drawings:

FIGS. 4 and 5 are cross-sectional and surface views, respectively, of films prepared from an In-Se/Cu-Se precursor, FIG. 6 is a surface view of a film prepared from an In-Se/In-Cu-Se precursor, FIG. 7 is a surface view of a film prepared from an In-Se/Cu-Se/In-Se precursor, and FIGS. 8 and 9 are cross-sectional and surface views of a film prepared from an In-Se/In-Cu-Se/In-Se precursor;

FIG. 12 is an In-Se/Cu-Ga-Se precursor structure heated at 550° C. for 20 min at 30 Å/s Se; FIG. 13 is an In-Se/In-Cu-Ga-Se precursor structure heated at 550° C. for 20 min at 30 Å/s Se; FIGS. 14 and 15 are an In-Se/In-Cu-Ga-Se precursor structure heated at 550° C. for 20 min at 45 Ås/ Se, where FIG. 14 is a cross-sectional view of the corresponding surface scan image in FIG. 15;

FIG. 17 is a cross-section of the corresponding surface scan image in FIG. 16;

DETAILED DESCRIPTION

Figure 1:
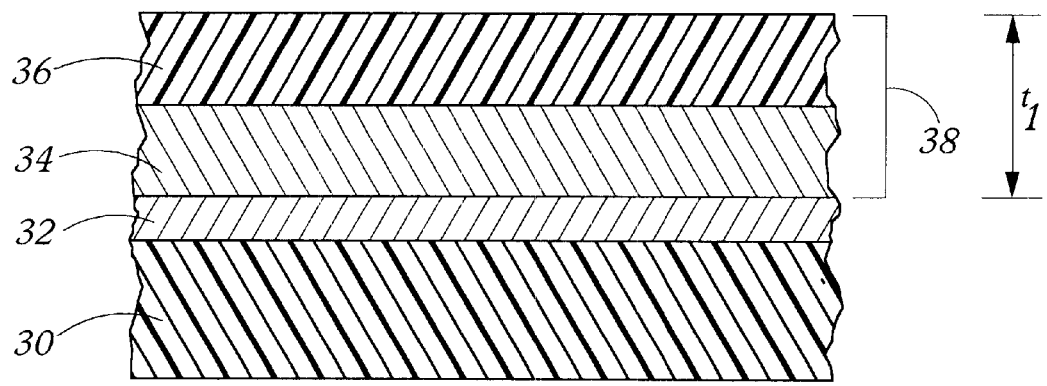
FIG. 1 is a cross-section illustration of a precursor deposited onto an unheated substrate after stage one of the method of the invention.

The process of the present invention comprises a novel, two-stage process for fabricating high-quality, thin-film Cu(In,Ga)(Se,S)$_2$-based semiconductor devices that are suitable for use in photovoltaic applications and are especially adaptable for solar cell applications. The first stage of the method of the invention comprises depositing a precursor comprising one or more layers onto an unheated or actively cooled substrate, and subsequently heating the substrate-supported precursor in the second stage of the method of the invention at an elevated temperature for a short period of time to form the semiconductor material. Each layer of the precursor is formed by co-depositing a group VIA element and a group IB and/or a group IIIA element, such that the group VIA and the group IB and/or group IIIA elements co-exist in the deposited precursor layer.

Group IB elements suitable for use in the method of this invention include copper (Cu), silver (Ag), and gold (Au). Preferably the group IB element is copper (Cu). Group IIIA elements suitable for use in the method of this invention include gallium (Ga), indium (In), aluminum (Al), and thallium (Tl). Preferably the group IIIA element is gallium (Ga) or indium (In). Group VIA elements of interest include selenium (Se), sulfur (S), and tellurium (Te), and preferably the group VIA element is Se.

For purposes of simplicity, the description of the processes of this invention will focus primarily on CuInSe$_2$-based structures. However, it should be understood that Ga or various combinations of In$_{1-X}$Ga$_X$, where $0 \leq X \leq 1$, may by substituted for the In component, and that S or various combinations of Se$_{1-y}$S$_y$, where $0 \leq X \leq 1$, may be substituted for the Se component described in these processes, and that such substitutions are considered to be equivalents for purposes of this invention. Also, as mentioned above, where several elements can be combined with or substituted for each other, such as In and Ga, or Se and S, in the component to which this invention is related, it is not uncommon in this art to include in a set of parentheses those elements that can be combined or interchanged, such as (In,Ga) or (Se,S). The descriptions in this specification sometimes use this convenience. It should also be understood that group IB, IIIA, and VIA elements other than Cu, In, Ga, Se, and S may be included in the description of the IB-IIIA-VIA alloys described herein, and that the use of a hyphen ("-"e.g., in Cu-Se or Cu-In-Se) does not indicate a compound, but rather indicates a coexisting mixture of the elements joined by the hyphen. Finally, also for convenience, the elements are discussed with their commonly accepted chemical symbols, including copper (Cu), indium (In), gallium (Ga), selenium (Se), sulphur (S), molybdenum (Mo), and the like.

As used herein, the term "chalcogen" refers to an element of group VIA of the periodic table. The term "chalcogenide" refers to a binary or multinary compound containing at least one chalcogen and at least one more electropositive element or radical. Preferably, the chalcogen is sulpher, selenium, or tellurium, and the "metal chalcogenide" is a metal selenide, metal sulfide, or some mixture thereof.

For the purpose of providing a detailed description and an enabling embodiment, but not for the purpose of limitation, this description refers to "metal chalcogenides," and "semiconductor films." Unless the text indicates otherwise, these terms are used interchangeably.

Figure 2:
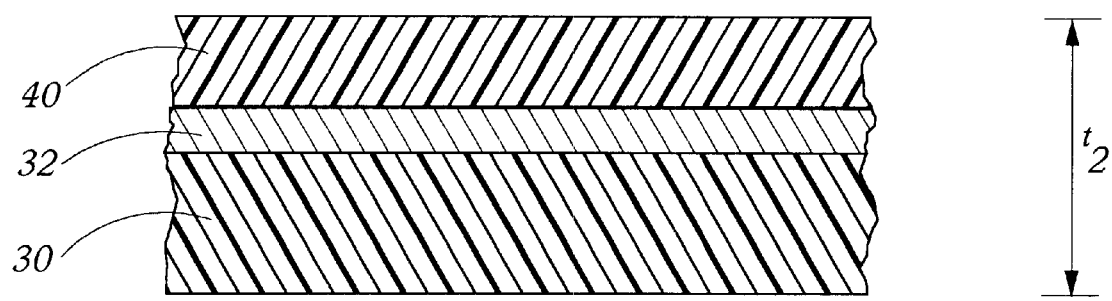
FIG. 2 is a cross-sectional illustration of a resulting semiconductor film after heating the film in FIG. 1 in stage two of the method of the invention.

With reference to FIGS. 1 and 2, the first stage of the process according to the present invention is to deposit a precursor 38 onto substrate 30, which may, but does not have to, have a coating 32, which will be described in more detail below. Any convenient substrate 30 capable of serving as a support for a semiconductor film produced according to this invention may be employed. The substrate 30 should be inert under the conditions in which it is employed as a support for the semiconductor film, such that the substrate does not react with the supported film or modulate the semiconductor properties of the film. The substrate should be of sufficient thickness to provide mechanical support to the film. The shape of the substrate is not critical to the invention. Suitable substrates include glass such as soda-lime silica, metals such as stainless steel and metal foils, high temperature plastics, ceramic, silicon, and the like.

As mentioned above, the substrate 30 may be coated with a metal layer 32 that enhances the adhesion of the semiconductor film to the underlying substrate. The metal layer 32 may also serve as an electrical contact layer in a photovoltaic cell in which the supported semiconductor film is incorporated. The metal layer 32 may be any one of molybdenum, chromium, tungsten, tantalum, titanium, and the like, where molybdenum (Mo) is preferred.

Stage one of the method of this invention comprises depositing an amorphous or nanocrystalline precursor 38 onto an unheated substrate 30. The precursor 38 may comprise one layer 34 or it may comprise two or more sequentially deposited layers, such as layers 34 and 36 illustrated in FIG. 1. There is no limit to the number of layers 34, 36, . . . , or in the precursor structure 38. However, from a commercial perspective, it is preferable that the precursor 38 comprise between 1–3 layers. Thus, the precursor 38 may comprise one layer comprising all the necessary group IB (e.g., Cu), IIIA (e.g., Ga and/or In) and VIA (e.g., Se) elements, wherein the group IB and group IIIA elements are present in the precursor layer in the correct atomic ratio, that is, the atomic ratio of the group IB and IIIA elements in the precursor will be approximately the same as the atomic ratio of the group IIB and IIIA elements in the final semiconductor film, within experimental error for measuring the stoichiometry of the film. In other words, if it is desired to prepare a semiconductor film having a group IB/group IIIA atomic ratio of b/a by the method of this invention, then the precursor 38 will be prepared such that the atomic ratio of the group IB/IIIA elements in the precursor is also b/a. For example, if it is desired to produce a CuInSe$_2$ semiconductor film having a Cu:In ratio of 1:1, then ratio of the Cu:In elements in the precursor 38 deposited in the first stage of the method of the invention should be 1:1.

Alternatively, the precursor may comprise two or more layers 34, 36 of various combinations of, for example group IB-VIA (e.g. Cu-Se), and/or group IIIA-VIA (e.g., Ga-Se), and/or group IB-IIIA-VIA (e.g., Cu-Ga-Se)-containing layers. In any event, the layer(s) 34, 36 of the precursor 38 are deposited onto the unheated substrate 30 in a predetermined, controlled manner such that, prior to the second step of the invention, which will be described below, the precursor 38 contains all the necessary group IB (e.g., Cu) and group MA (e.g., Ga and/or In) elements in the correct atomic ratio, so the stoichiometry of the group IB and IIIA elements in the precursor 38 will be approximately equal to the stoichiometry of the group IB and group IIIA elements in the semiconductor film produced by the method of the invention. Therefore, the method of the invention is economical in that it avoids the need to use an excess amount of any of the group IB or group IIIA elements in forming the precursor 38. The group VIA element (e.g., Se and/or S) present in the precursor 38 may vary between about 40–70%, and preferably the group VIA element concentration in the precursor is about 50%.

In one embodiment of the first stage of the method of the invention, illustrated in FIG. 1, the substrate 30 is coated with precursor 38 by sequential deposition of a group IIIA-VIA (e.g. Ga-Se, In-Se, or Ga-In-Se) layer 34, followed by deposition of a group IB-VIA (e.g., Cu-Se) layer 36. Layers 34 and 36 may be deposited using any convenient deposition method, including electrodeposition, sputtering, evaporation, or the like. A preferred method of depositing precursor layers onto the unheated substrate is the hybrid sputter-evaporation technique using DC magnetron sputtering, as described in U.S. Pat. No. 4,465, 575, the disclosure of which is incorporated herein by reference. A more particularly preferred method is a modification of the DC magnetron sputtering incorporating specially designed shields and sputter guns to prevent group VIA (e.g., Se) poisoning of the group IB (e.g., Cu) and group IIIA (e.g., Ga, In, or In-Ga) targets in the sputtering apparatus (not shown), as will be described in more detail in Example 4 below. As used throughout this description, the term "target" refers to the solid source of an element which is used in a sputtering-evaporation apparatus. For example, a copper (Cu) target refers to a solid piece of copper which is sputtered in order to create the copper atoms which then deposit onto the substrate. Likewise, an indium (In) target refers to a solid piece of indium which upon sputtering produces indium atoms which are deposited onto the substrate, and a gallium (Ga) target refers to a solid piece of gallium which upon evaporating produces gallium atoms which deposit onto the substrate. A Cu-Ga target is a specially prepared metal alloy comprising copper and gallium, as described in the examples below.

As used throughout this description, the term "target" refers to the solid source of an element which is used in a hybrid sputtering-evaporation apparatus. For example, a copper (Cu) target refers to a solid piece of copper which is sputtered in order to create the copper atoms which then deposit onto the substrate. Likewise, an indium (In) target refers to a solid piece of indium which upon sputtering produces indium atoms which are deposited onto the substrate, a gallium (Ga) target refers to a solid piece of gallium which upon evaporating produces gallium atoms which deposit onto the substrate. A Cu-Ga target is a specially prepared metal alloy comprising copper and gallium, as described in the examples below.

The hybrid sputtering and evaporation method used to deposit layers 34 and 36 should be carefully and precisely controlled so that the atomic ratios of the group IB (e.g., Cu) and group IIIA (e.g., Ga and/or In) elements in precursor 38 are the same as the desired atomic ratios of the group IB and group IIIA elements of the final semiconductor product 40, as explained above.

It is to be understood that although the various precursor layers are described below as being deposited in a particular sequence, the deposition sequence may be altered, as will be clear to persons skilled in the art. However, preferably, the first precursor layer 32 deposited onto the unheated substrate 30 is a group IIIA-VIA-containing layer (e.g., an In-Se, Ga-Se, or In-Ga-Se layer), since precursor 38 having a IIIA-VIA-containing layer structure deposited first was found to result in thin-films having better adhesion to the substrate 30, as described below in Example 3. Further, it is preferred that at least one layer of the precursor 38 comprise a IB-VIA layer (e.g., a Cu-Se layer) in order to obtain large grain thin-films after thermal treatment of the precursor 38 in the second stage. It is known that dense films with large grains provide semiconductor films with better morphology and hence, better quality.

Deposition of the individual group IB (e.g., Cu) and group IIIA (e.g. Ga and/or In) elements is carried out in the presence of the group VIA (e.g., Se and/or S) element, where the various group IB and group IIIA elements may be deposited sequentially, e.g., by sputtering an In target (the solid source of In in the sputtering apparatus—not shown) in the presence of Se to form an In-Se layer, followed by sputtering a Cu target (the solid source of Cu in the sputtering apparatus—not shown) in the presence of Se to form a Cu-Se layer. Alternatively, the group IB (e.g. Cu) and group IIIA (e.g. Ga and/or In) elements may be deposited simultaneously in various combinations, for example by sputtering a Cu:Ga target (the solid source of Cu and Ga in the sputtering apparatus—not shown) in the presence of Se to form a Cu-Ga-Se layer, or by simultaneously sputtering an In target and a Cu target in the presence of Se to form an In-Cu-Se layer.

Thus, referring again to FIG. 1, layer 34 may be deposited on an unheated substrate 30 in stage one of the invention by evaporating a group IIIA target (e.g., Ga) and/or sputtering a group IIIA (e.g., In) target while simultaneously evaporating a group VIA (e.g. Se) element. The group VIA element will preferably comprise selenium vapor in an inert atmosphere. For example the sputter pressure may be held at 10 mTorr argon while simultaneously evaporating Se from a boat, thus providing an Ar:Se vapor atmosphere. The result of the first deposition of the first stage of the invention as illustrated in FIG. 1 is an amorphous or nanocrystalline layer 34 deposited on the unheated substrate 30, where the layer 34 is a group IIIA-VIA layer (e.g. In-Se, Ga-Se, or In-Ga-Se) which comprises a group IIIA (e.g., Ga and/or In) element coexisting with a group VIA (e.g. Se) element, with possible binary chalcogenide formation.

Next, to complete precursor 38 as illustrated in FIG. 1, layer 36 is deposited onto layer 34 by sputtering a group IB (e.g., Cu) target while simultaneously evaporating the group VIA (e.g., Se) element. The result of the second deposition of the first stage of the invention as illustrated in FIG. 1 is an amorphous or nanocrystalline group IB-VIA layer 36 (e.g. Cu-Se) deposited onto layer 34, where the layer 36 comprises a group IB (e.g. Cu) element coexisting with a group VIA (e.g., Se) element, with possible binary chalcogenide formation. Therefore, the first stage of the method of the invention provides the deposition of an amorphous or nanocrystalline precursor 38 onto an unheated substrate 30. The precursor 38 in FIG. 1 contains all the necessary group IIIA and group IB constituents in layers 34 and 36, respectively, in the same stoichiometric ratio that is desired for the final semiconductor film 40 shown in FIG. 2.

For purposes of illustration, but not meant to be limiting, in preparing CIGS films by the two-stage method of the invention, the Cu layer is preferably sputtered in stage one of the method of the invention to deposit a 3000 Å thickness of Cu, and the total amount of the group IIIA (i.e., In, Ga, or In:Ga) element deposited in the first stage of the method of the invention is adjusted to provide a final film 40 thickness of 2.5 micrometers.

In each of the above-described depositions, the group IB metal is sputtered at a group IB flux, the group IIIA metal is evaporated or sputtered at a group IIIA flux, and the group VIA element is evaporated at a group VIA flux. In each of the above-described depositions, the flux rate of the group VIA vapor is between about 0.5–3.0 times the total sum of the group IB flux and the group IIIA metal flux, and preferably the flux of the group VIA vapor is approximately equal to the 1× the total group IB/group IIIA metal flux. For example, in the deposition of an In:Se layer by sputtering an In target, if the flux of In is 2 and the Se flux is 2× the total metal flux, then the Se flux will be 4. Likewise, in the deposition of a Cu:In:Se layer by simultaneously sputtering a Cu target and an In target, if the Cu flux is 3, the In flux is 2, and the Se flux is 2× the total metal flux, then the Se flux will be 2×(2+3)=10. As used herein, the term "flux" refers to the amount of some quantity flowing across a given area per unit time. For example, "Se flux" refers to the mass of Se flowing over the substrate 30 in the deposition chamber per unit time.

Figure 3:
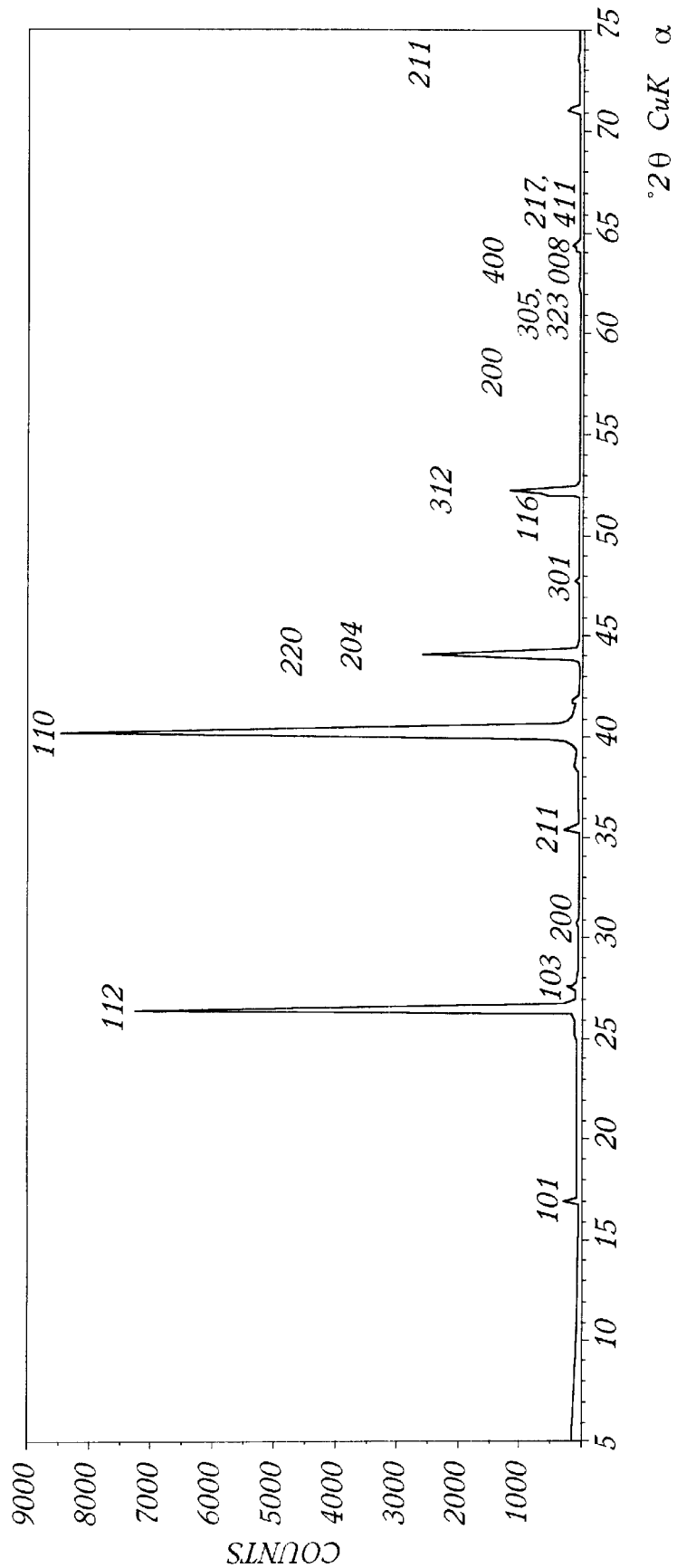
FIG. 3 is a XRD spectrum of an In-Se/In-Cu-Se/In-Se precursor structure deposited onto an unheated substrate with a Se flux=1× the total metal flux and subsequently heating at 550° C. for 20 minutes under 30 Å/s Se.

FIG. 3 shows x-ray diffraction (XRD) spectra of various CIS and CIGS precursor structures 38 deposited onto an unheated substrate 30, where the Se flux during precursor deposition ranged from 0.5–3.0 times the total metal flux. As can be seen in spectra (a)-(i), the XRD of all precursors 38 have a broadened increased background, which is typical for very low ordering, i.e., amorphous or nanocrystalline, material. In other words, if the precursors had been deposited as large grain crystals, the spectra in FIG. 3 would have shown sharp, well-defined peaks. Thus, FIG. 3 demonstrates that precursor 38 comprises group IB (e.g. Cu), group IIIA (e.g. Ga and/or In), and group VIA (e.g., Se) elements coexisting, where phase formation is amorphous.

As stated above, in an alternate embodiment the precursor may comprise only one layer (not shown). In this embodiment, the precursor may be deposited by co-depositing the group IB (e.g. Cu) and group IIIA (e.g. Ga and/or In) metals while simultaneously evaporating a group VIA (e.g. Se) element to deposit a single amorphous group IB-IIIA-VIA precursor layer, for example, a single Cu-Ga-Se layer, or a single Cu-In-Se layer, or a single Cu-In-Ga-Se layer.

As stated above, the deposition of the precursor 38 as shown in FIG. 1 takes place on an unheated substrate 30, which is advantageous over conventional hot deposition methods used in prior art methods, for several reasons. When using glass as substrate 30, the glass substrate 30 loses its structural rigidity in the 500°–600° C. temperature range and can become somewhat soft. Thus, deposition of precursor 38 onto an unheated substrate 30 according to the method of the invention avoids some of the complications associated with handling large sheets of glass at these high temperatures. In addition, other substrates such as polyamides are desirable for application in photovoltaic devices, however, polyamides cannot withstand the prolonged temperatures above 420–440° C. which are used in conventional fabrication methods. Thus, the method of the invention, wherein the precursor is deposited onto an unheated substrate, also allows the use of polyamide substrates and the like.

Once the precursor 38 comprising the group IB (e.g., Cu), IIIA (e.g., Ga and/or In), and VIA (e.g. Se) elements in the correct atomic ratios is deposited onto the unheated substrate 30, as described in the first stage above, the substrate 30-supported precursor 38 is subjected to a short thermal processing in stage two of the process of the invention to make the monophasic semiconductor film 40. Stage two of the process of the invention comprises heating the substrate 30-supported precursor 38 at an elevated temperature for a period of time sufficient to anneal and recrystallize the precursor, such that the amorphous precursor 38 is converted into a single-phase semiconductor material 40. Preferably the heating step in the second stage of the method of this invention is done in a vacuum (typically $10^{-7}$ to $10^{-5}$ Torr). Alternatively, the heating step may be carried out in an inert atmosphere, i.e., an atmosphere comprising gas molecules that will not react with and thus contaminate or degrade the precursor elements. The inert atmosphere can be any known inert gas such as argon, xenon, helium, or nitrogen.

Because the conversion of the precursor layer 38 to the single-phase semiconductor film 40 during the heating step can result in a decrease in the group VIA (e.g., Se) element content of the single-phase film 40 as compared to the precursor layer 38, it is preferred that the heating step is carried out under exposure to a group VIA element as a vapor to prevent group VIA depletion. In embodiments where the group VIA element is Se, group VIA overpressure can be maintained, for example, by evaporating Se from a deposition boat positioned in the sputtering/evaporation apparatus (not shown) at a rate of about 15–45 Å/sec. Alternatively, the Se can be introduced in the form of a reactive compound, such as by using $H_2Se$ gas or an organic Se-containing precursor gas such as diethylselenide (DES).

The characteristics of the final group IB-IIIA-VIA (e.g., $CuGaSe_2$, $CuInSe_2$, $CuIn_{1-x}Ga_xSe_2$) semiconductor product can be controlled by varying the parameters in the second (heating) stage of the method of the invention, such as the heating rate, the final heating temperature, the heating time, and the group VIA (e.g., Se) overpressure rate. In a preferred embodiment, the heating rate is between about 50° C./min and 300° C./min, the temperature is between about 400–550° C., and the time of heating is between about 10–30 minutes. Preferably the flow rate of the group VIA element maintained during the annealing step is about 15–45 Å/s. Once the substrate reaches the desired elevated temperature, at which point the precursor has annealed, the temperature is maintained for an appropriate period of time to allow the annealed precursor to recrystallize. Preferably the heating is carried out under a group VIA (e.g. Se) overpressure. The term "annealing", a term of art, refers to heating a material and holding at a suitable temperature primarily to soften metallic materials. The term "recrystallization", also a term of art and as used herein, generally refers to the process in which large grain crystalline or polycrystalline structures are grown epitaxially from liquid after the metal is annealed.

After the heating step, the temperature of the film 40 is ramped down to a temperature range of about 250°–350° C., preferably about 300° C., and preferably while maintaining a Se overpressure, whereupon the Se overpressure is removed and the temperature is ramped down to room temperature. It has been found that ramping down the film temperature at the rate of about 12.5° C. per minute is usually satisfactory.

The result of the second stage of the method of the invention is a single-phase semiconductor film 40 (FIG. 2). As shown by FIGS. 1 and 2, the thickness $t_2$ of the film 40 in FIG. 2 is approximately the same as the total thickness $t_1$ of the precursor 38 in FIG. 1. This is due to the fact that (i) there is no loss of group IB (e.g. Cu), group IIIA (e.g. Ga and/or In), or group VIA (e.g. Se) elements during the heating step of the method of the invention; and (ii) there is no volume change when the precursor is annealed to form the film, which is significant, since a change in density would result in a change in film thickness, even if there were no loss of material, as will be described in detail in Example 5. Thus, the method of the invention is economical in that it avoids the need to use excess amounts of metals either in the first stage deposition process or in the second stage annealing process.

The resultant substrate 30-supported single-phase semiconductor films 40 produced by the two-stage method of this invention are group IB-IIIA-VIA films or group IB-IIIA-IIIA-VIA-films, such as $Cu(In,Ga)(Se,S)_2$ alloys. Where the semiconductor films are single-phase alloys of Cu, Ga, In, and Se, the films may be described by the formula: $CuIn_{1-x}Ga_xSe2$, where $0 \leq X \leq 1$. The semiconductor films produced by the method of the invention find use in photovoltaic applications, where they typically exhibit an open circuit voltage ($V_{oc}$) of about 400 mV for CIS, and about 700–900 mV for CGS-based devices, while the $V_{oc}$ values for CIGS lie between about 400–900 mV depending on the Ga content. Typically short-circuit current densities ($J_{sc}$) of devices based on the respective absorber materials are about 30 mA/cm² for CIS, about 16 mA/cm² for CGS, and about 16–40 mA/cm² for CIGS, depending on Ga content.

Following thermal processing of the precursor film, the metal chalcogenide semiconductor film may be incorporated into a photovoltaic device (solar cell) by methods known in the art. With the exception of the semiconductor materials of the present invention, the component structures of the solar cell are known in the art and are not a part of this invention.

The novel two-stage process described herein offers several advantages over methods known in the art for preparing CI(G)S semiconductor films. A significant advantage associated with the method of the present invention is the improved predictability and reproducibility of the fabrication process for making semiconductor films, and the significant increase in control over the final composition of the semiconductor film. As discussed above, conventional processes require precise monitoring and manipulation of the ratio of metals during the deposition process—a problem which has thus far prevented mass production of mixed-metal chalcogenide semiconductor films. Surprisingly, however, the metal stoichiometry of the mixed-metal chalcogenide films produced according to the present invention is nearly identical to the stoichiometry of the precursor starting materials.

As shown in Table 5 of Example 2, a Cu-In-Ga-Se precursor with a metal composition of 45.14% Cu, 42.48% In, and 12.39% Ga deposited unto an unheated substrate produced a Cu-Ga-In-Se semiconductor film with a composition of 45.32% Cu. 42.05% In, and 12.63% Ga after treatment of the precursor at 500° C. for 10 minutes and a Se rate of 15 Ås/. Thus, when a particular metal ratio is desired in the semiconductor film (e.g., $CuIn_{1-x}Ga_xSe_2$), the ratio is achieved simply by depositing a precursor comprising the corresponding molar ratio of metals (e.g., Cu, In, Ga) and chalcogens (e.g., Se) onto an unheated substrate and heating the substrate-supported precursor at 420–550° C. for 10–30 minutes, preferably under a Se overpressure. Because the chemical composition of the semiconductor film parallels that of the precursor, the stoichiometries of semiconductor films can be conveniently controlled by the method of the invention. Thus, the method of the present invention offers improved control over film composition, and hence improved reproducibility and product yield, over prior art processes. Moreover, because the stoichiometries of semiconductor films are predetermined during precursor deposition, the present invention offers the additional benefit of more efficient and cost effective utilization of materials, by eliminating the waste commonly associated with conventional fabrication processes.

Another significant advantage associated with the methods of the present invention is the ability to deposit the precursors onto unheated substrates prior to thermal treatment, which significantly reduces the thermal budget, since several precursor-coated substrates can be prepared separately and then collected and annealed in a common chamber. This is especially important in industrial production of such films. Beyond the inherent energy savings associated with a reduced thermal budget, the ability to deposit precursors on unheated substrates allows the use of lower cost substrates, such as sodalime glass, or substrates that deform at higher temperatures, such as polyamide substrates.

The device performance of CIS absorbers produced by the method of this invention is a function of recrystallization temperature but is independent of the precursor layer structure, resulting in devices of approximately 10% and 13% conversion efficiency for $CuInSe_2$ and $CuIn_{0.75}Ga_{0.25}Se_2$, respectively. Further, the method of this invention allows the use of temperature sensitive substrates such as polyamide in the production of CI(G)S semiconductor devices.

The following examples demonstrate the practice and utility of the present invention but are not to be construed as limiting the scope thereof. Any suitable laboratory equipment known to those in the art can be utilized to synthesize precursor films, and analyze properties thereof, with the exceptions described below. In the examples, the precursors and the selenized films were studied with respect to their elemental composition using inductively coupled plasma spectroscopy (ICP) (samples analyzed by ICP were dissolved in 5% vol. $HNO_3$), electron probe microanalysis (EMPA) (data was obtained for acceleration voltages of 10 and 20 kV), and Auger electron spectroscopy (AES) depth profiles (a sputter etch rate of 1000 Angstroms/min was employed in the AES analysis). Film morphologies and thicknesses were determined by scanning electron microscopy (SEM). Structural information was obtained via X-ray diffraction (XRD) analysis in the 2-theta range of 5–75° with a 0.02° step size and 3 second count time. Device performance was evaluated by recording room temperature (RT) dark and light (1000 W/m²) I–V characteristics, as well as quantum efficiency (QE) spectra under zero and reverse bias. Se rates during deposition of the precursors were calculated using the following equation:

$$Se_{rate} = \left(\frac{X_{flux}}{Se_{flux}}\right) \times X_{rate} \times Y$$

EQUATION TO BE RE-ENTERED where X is Cu, In, or Ga, and Y is the flux multiplication factor (0.5×, 1×, 1.5×, or 2×).

EXAMPLE 1

Preparation of CIS Semiconductor Films $CuInSe_2$ films were prepared by depositing precursor types (a), (c), (e), (g), and (h), shown in Table 1, onto the surface of an unheated, Mo coated soda lime glass substrates. The layers of the precursors were deposited sequentially in the order shown for precursor film types (a), (c), (e), (g), and (h), by DC magnetron sputtering from In targets and Cu targets in an Ar:Se-vapor atmosphere. The sputter pressure was held at 10 mTorr Ar while simultaneously evaporating Se from a molybdenum boat. The deposition rates for the metals were 2 Ås/ for In and 3 Ås/ for Cu, and the Se flux during the In and Cu depositions was approximately equal to one times (1×) the In flux and the Cu flux, respectively. The In amount was adjusted according to the desired ratios with respect to a Cu thickness of 3000 Angstroms to achieve an In thickness of 7500 Å.

As will be described in detail in Example 4, the use of specially designed sputter sources and specially prepared In targets, as well as the relative spatial source arrangement inside the deposition chamber, ensured that Se poisoning of the targets was avoided, even at low sputter rates. Further, since calibrated sputter guns were employed, it was not necessary to monitor deposition rates of the Cu or In, and therefore only the Se rate was monitored (via a quartz crystal). The average and standard deviation values (1σ for the metals between 0.31 to 0.60 at. %, and approximately 0.80 at. % for Se) of 12 films indicated stable metal deposition rates, and thus, the absence of Se poisoning. Finally, incorporating a substrate rotation mechanism into the deposition chamber allowed for compositional uniformity across the substrate.

In order to derive the optimal fabrication conditions for CIS film formation, the following annealing parameters were varied: selenization temperature T (420, 500, and 550° C. ), selenization time t (20, 40, and 60 minutes), heat ramp rate (100, 200, and 300° C. /min), and Se rate during selenization (15, 30, and 45 Å/s). After heating, the films were cooled to 300° C. while maintaining the Se overpressure, whereupon the Se overpressure was turned off and the finished film was cooled to room temperature. The various precursors structures prepared, as well as the annealing conditions used to form the single-phase CIS films, are summarized in Table 2. All precursor types tested in Table 2 employed an In-Se layer as the first layer deposited onto the Mo back-contact, and contained a slight excess of In with respect to Cu.

As can be seen from Table 2, only a negligible fluctuation in elemental composition was observed, suggesting the absence of a dependence on precursor type and selenization conditions. In addition, AES analysis showed a uniform elemental distribution throughout the films, with only a slight increase in In near the Mo surface, due to the fact that all precursor structures employed an In-Se layer deposited onto the Mo substrate and contained a slight excess of In with respect to Cu. With respect to structural analysis, single phase CIS films with a preferred (112) orientation were obtained for all runs, indicating that for CIS film formation there is no dependence on the selenization parameters listed in Table 2. A representative XRD spectra is shown in FIG. 3 for a film prepared from precursor type (h) (In-Se/In-Cu-Se/In-Se) deposited onto an unheated substrate and subsequently selenized at 550° C. for 20 min, employing a heat rate of 300° C. /min and a Se rate of 30 Ås/. The absence of reflections arising from $Cu_xIn_ySe$, secondary phases and the strong, sharp peak at 3.351 Å indicate that single phase $CuInSe_2$ with a preferred (112) orientation has been obtained.

Figure 4:
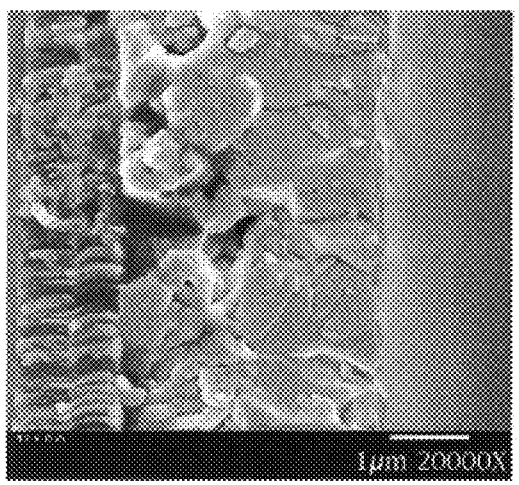
FIGS. 4–9 are SEM micrographs of CIS films prepared from various precursor structures treated at 550° C. for 20 minutes at a heat rate of 300° C. /min, and 30 Å/s Se.
Figure 5:
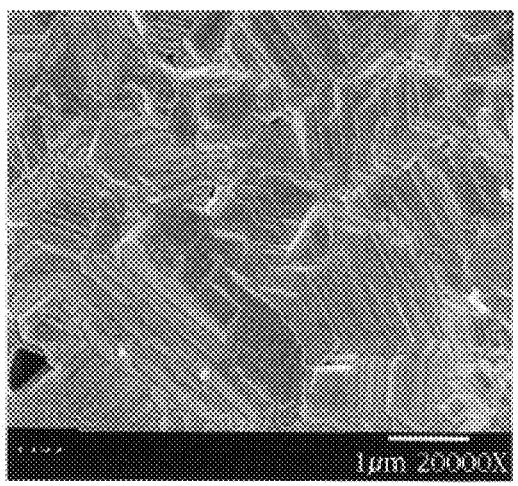
Figure 6:
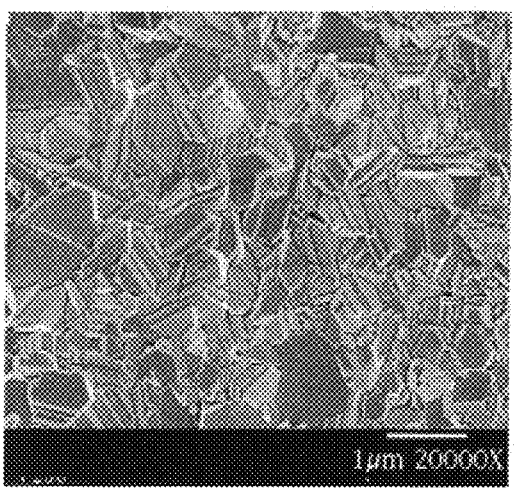
Figure 7:
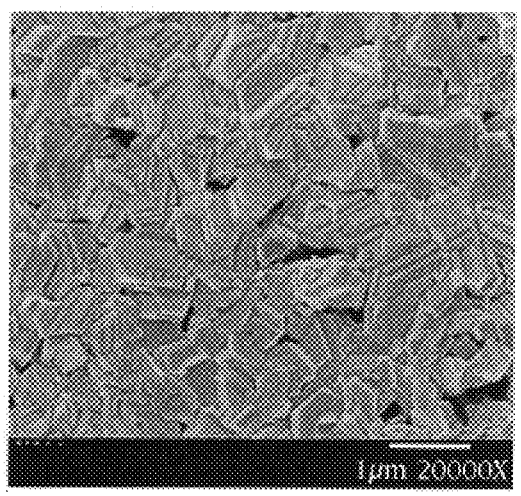
Figure 8:
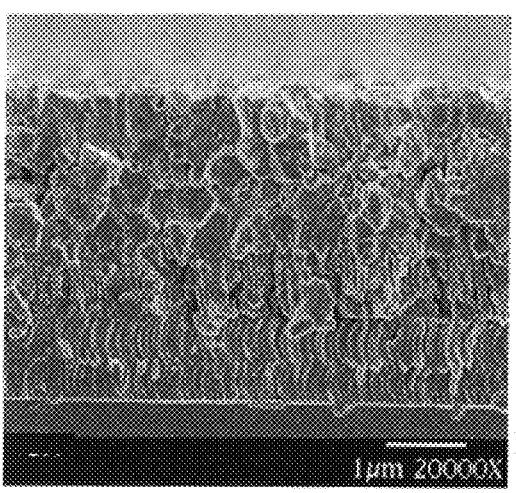
Figure 9:
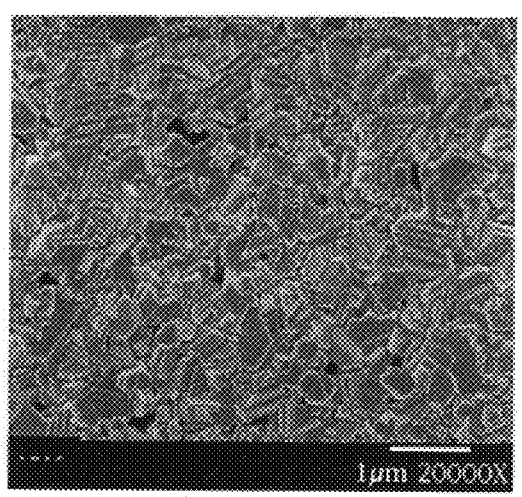

Correlating film morphology to Se rate and selenization time for the runs summarized in Table 2 revealed no observable dependence. However, film morphologies of the CIS films show a dependence on the precursor layer structure. FIGS. 4/5, 6, 7, and 8/9 show SEM micrographs of CIS films prepared from precursor types (c), (e), (g), and (f), respectively. As can be seen from FIGS. 4–9, $CuInSe_2$ prepared from an In-Se/Cu-Se precursor (type c) (FIGS. 4 and 5) showed very large grains, suggesting that CIS formation took place via reaction of $In_xSe_y$ into liquid $Cu_xSe$. Substitution of the Cu-Se layer with an In-Cu-Se layer (i.e., using precursor type (e) having the structure In-Se/In-Cu-Se) showed a lessened $Cu_xSe$ assisted grain growth, resulting in smaller grains (FIG. 6). Grain size for $CuInSe_2$ films obtained from In-Se/Cu-Se/In-Se type (g) precursors (FIG. 7) was found to be comparable to that from In-Se/In-Cu-Se structures. The use of In-Se/In-Cu-Se/In-Se type (h) precursors resulted in even smaller grains (FIGS. 8 and 9).

A slight dependence on the heat rate was observed for a given annealing temperature in the case of the precursor structures involving three layers, (i.e., types (g) and (h)). In both cases films showed increasingly dense morphologies with an increase in heat rate. In addition, reducing the selenization temperature from 550° C. to 500° C. or 420° C. for precursors of type (h) showed a slight increase in film density accompanied by an increase in grain size. As for voids observed at a varying degree in the examined films prepared in Table 2, none appeared to span throughout the complete film thickness.

In conclusion, elemental compositions of the CIS films showed no dependence on the precursor type or on the selenization conditions (i.e., heat rate, selenization temperature, selenization time, or Se flux during selenization), and uniform elemental distribution was observed throughout the film. Structural analyses of the CIS films showed no dependence on selenization conditions, and all films were found to be single-phase CIS compounds.

CIS film morphology showed a dependence on the number of layers in the precursor (i.e., two layers were better than three), a slight dependence on the heat rate during selenization (300° C. /min gave better results), and no dependence on the Se rate during selenization or on the selenization time.

Table 3 summarizes the device performance of CIS films prepared from the various precursors as described in Table 2. The total area of each device was 0.43 $cm^2$, and no anti-reflective (AR) coating was employed. Substituting the Cu-Se layer in a type (c) precursor with an In-Cu-Se layer (type (e) precursor) resulted in an increase in open-circuit voltage $V_{oc}$, while no dependence of $V_{oc}$ on the selenization time or heat ramp rate was observed for CIS prepared from precursors of type (e). Only minor improvements in $V_{oc}$ were achieved in precursor structures comprising three layers when heating the precursors at 550° C. for 20 minutes. However, increasing the heat rates resulted in higher open-circuit voltages.

A reduction in the selenization/recrystallization temperature was observed to lead to an increase in the fill-factor (FF), and subsequently an increase in $V_{oc}$, for all layer structures investigated. The latter observations are in agreement with the observed improvement in film morphology under the described conditions.

As for the short-circuit current densities ($J_{sc}$) no clear dependence on the precursor structure and annealing conditions could be detected, and the small fluctuations could also be due to minor variations in device area. In addition, the marginal fluctuations in absorber composition did not seem to have a detectable effect on the subsequent device performance. Quantum efficiency measurements showed a decrease in current collection with an increase in wavelength λ..

Examination of the light and dark I–V curves for the CIS-only devices showed them to exhibit large $R_{sh}$ values, thus ruling out the possibility of pinholes in the absorber layer. In addition, the series resistance for the devices was negligible and no dependence on the precursor layer sequence could be observed.

Adding 1000 Å $MgF_2$ as an antireflective coating onto the previously measured 9.68% efficient device resulted in an expected improvement in $J_{sc}$ by about 1.5 $mA/cm^2$. The device parameters were as follows: total area=0.431 cm$^2$, $V_{oc}$=438 mV, $J_{sc}$=31.91 mA/cm$^2$, FF=71.11%, η=9.95%.

The device performance of up to 10% for the CuInSe$_2$ absorbers prepared to date by the novel two-stage process of the present invention compares favorably to the 11.2% conversion efficiency obtained for CIS-only from conventional methods involving Se-vapor selenization of metallic precursors. Further, as described in detail, it was observed that device performance of CIS absorbers on soda lime glass substrates is a function of recrystallization temperature and independent of the precursor layer structure, resulting in devices of approximately 9% conversion efficiency at T=420° C. Being able to achieve good device efficiencies at lower temperatures has a significant impact on cost reduction due to a decrease in the thermal budget requirements. In addition, the ability to produce device quality films at lower temperatures (e.g., 420° C. ) means that the method of the present invention allows the use of temperature-limited substrates such as polyamides.

EXAMPLE 2

Preparation of Semiconductor Films using a Cu:Ga Target

To prepare the Cu(In,Ga)Se$_2$ films, precursor films were deposited by depositing various combinations of Cu-Ga-Se layers, In-Se layers, and Cu-Ga-In-Se layers onto unheated, Mo-coated soda lime glass substrates. The Cu-Ga-Se layers were deposited by DC magnetron sputtering of a Cu:Ga target having a Cu:Ga ratio of 3:1 while simultaneously evaporating Se from a molybdenum boat, where the Se flux rate during deposition of each of the precursor layers was either 0.5, 1.0, 1.5, or 2 times the total metal flux of the metal(s) during deposition of a particular layer. The Cu-Ga-In-Se layers were deposited by simultaneously DC magnetron sputtering of a Cu:Ga target having a Cu:Ga ratio of 3:1 and an In target, while simultaneously evaporating a Se target from a molybdenum boat. The In-Se layers were prepared by sputtering from a specially designed In target as described in Example 4. The sputter pressure was held at 10 mTorr argon. The deposition rates for the metals were 2 Å/sec for In and 3 Å/sec for Cu and Ga. The Cu thickness was chosen to be 3000 Å and the thicknesses of Ga and In layers were adjusted with respect to the Cu thickness to yield a Ga thickness of 1500 Å and an In thickness of 5500 Å. The use of specially designed sputter sources and specially prepared In targets, as well as the relative spatial source arrangement inside the deposition chamber, as described in Example 4, prevented Se poisoning of the targets even at low sputter rates.

The first layers of the precursors were deposited by sputtering in the presence of Se as described onto the surface of an unheated, Mo-coated soda lime glass substrates, followed by sequential deposition of subsequent layers. The temperature of precursor films was ramped up to the annealing/recrystallization temperature at a rate of 300° C. per minute, where the annealing/recrystallization temperature was between 420–550° C. The annealing/recrystallization temperature was maintained for 20 minutes while maintaining an overpressure of Se by evaporating Se from a Mo boat. The flow rate of the Se vapor overpressure was between 15 and 45 Å/sec. The film was then cooled down to 300° C. while maintaining the Se overpressure, whereupon the Se overpressure was turned off and the finished film was cooled to room temperature.

Table 4 shows several precursors layer structure types (b), (d) and (f), each comprising layers which were prepared by sputtering a Cu:Ga target having a Cu:Ga ratio of 3:1. For example, precursor type (b) was prepared by first sputtering a Cu:Ga target in a Se atmosphere to form a Cu-Ga-Se layer, and then depositing a second layer comprising In-Se on the Cu-Ga-Se layer by sputtering from an In target in a Se atmosphere. Precursor type (d) was made in a similar manner as precursor type (b), with the exception that the layers in type (d) were deposited in the opposite order as those for type (b). Precursor type (f) was prepared by first sputtering an In target in a Se atmosphere to form an In-Se layer, and then depositing a second layer comprising In-Cu-Ga-Se by simultaneously sputtering from an In target and a Cu:Ga target in a Se atmosphere.

Figure 10:
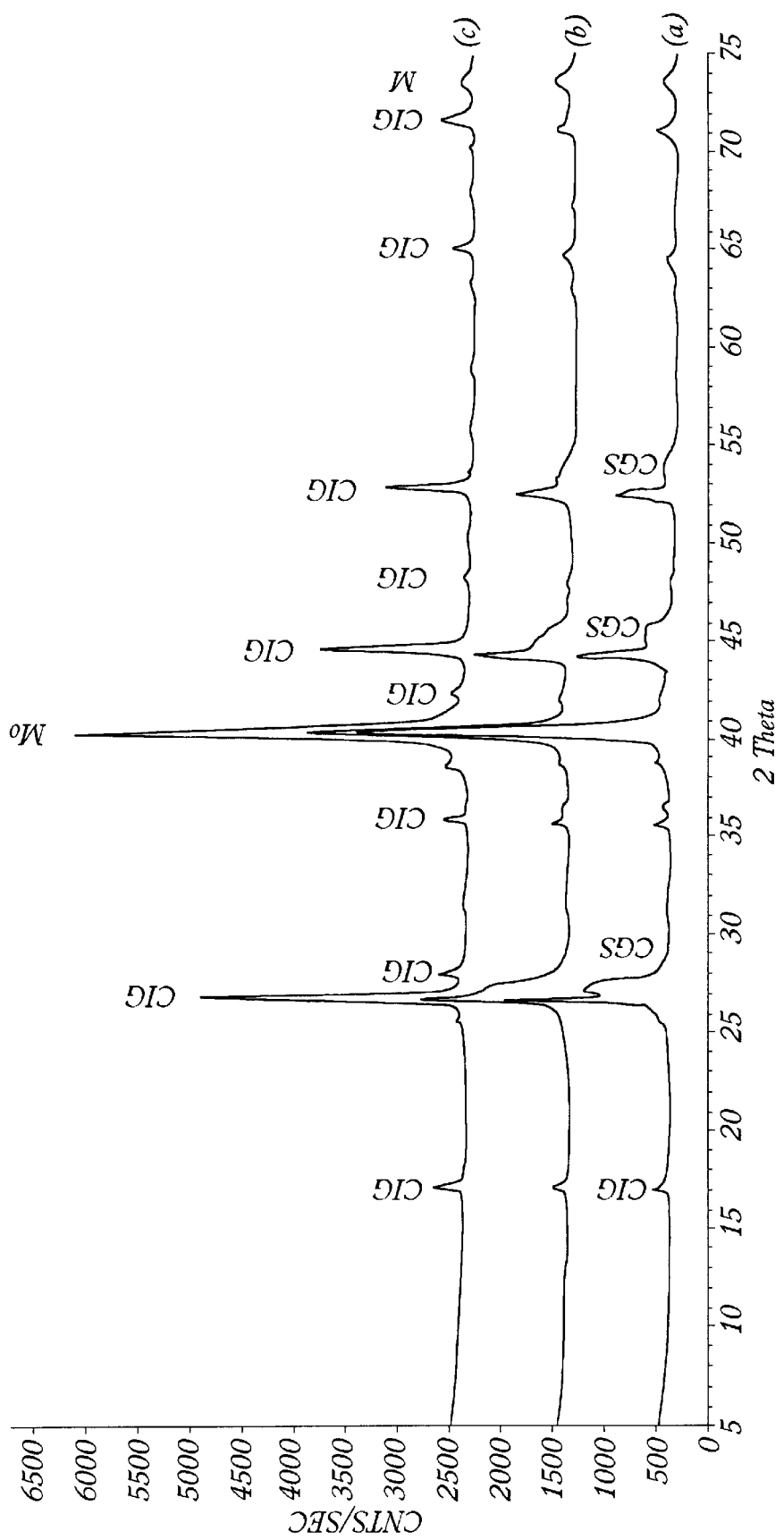
FIG. 10 shows three x-ray diffraction (XRD) spectra for In-Se/Cu-Ga-Se precursor structures treated at 420° C. for 30 minutes at a Se flow rate of 15 Å/s (curve a); 500° C. for 30 minutes at a Se flow rate of 15 Å/s (curve b); and 550° C. for 20 minutes at a Se flow rate of 15 Å/s (curve c)

Thermal treatment of precursor structure type (d) (In-Se/Cu-Ga-Se) at 420, 500, and 550° C. for 10, 20, and 30 min at 15 Å/s/ Se and a heat rate of 300° C. /min was carried out in order to determine if single phase CIGS could be prepared. X-ray diffraction (XRD) analysis revealed that obtaining single-phase material was more a function of treatment temperature rather than time (FIG. 10). When precursor type (d) was annealed and recrystallized at 420° C. (FIG. 10, spectrum a) or at 500° C. (FIG. 10, spectrum b), mixed phases of CGS and CIGS were observed by XRD even after 30 min. However, treatment of precursor type (d) at 550° C. for at least 20 min resulted in a single phase CIGS (FIG. 10, spectrum c). Comparison of the XRD spectrum (c) in FIG. 10 with the Joint Council on Powder Diffraction Studies (JCPDS) data file 35-1102 for a CIGS having the formula CuIn$_{0.7}$Ga$_{0.3}$Se$_2$ showed a very good match of the observed peaks in spectrum (c) with the JCPDS database, which is consistent with a determined sample composition of 23.86±0.26 at. % Cu, 18.95±0.17 at. % In, 7.20±0.18 at. % Ga, and 49.99±0.25 at. % Se. Additional peaks were observed for the Mo back electrode, as well as peaks that have already been observed in the precursor and were assigned to a small amount of unbound Se. Thus, future annealing/recrystallizations of CIGS films prepared using a Cu:Ga target were carried out for 20 min at 550° C. Comparison of the compositional data for precursor type (d) and for CIGS films prepared by annealing/recrystallizing precursor type (d) using three different treatment conditions, summarized in Table 5, revealed there was no loss of metal during the heating step. The elemental concentrations listed in the first three rows of Table 5 are normalized for the metals only, while the values given in the last four rows are normalized to the total elemental content in the respective films.

With respect to film morphology of these films as a function of Se content in the precursor as well as Se rate during annealing/recrystallization, it was found that precursors having approximately 50 at. % Se (i.e., precursors deposited with an Se flux that was equal to 1× the total metal flux) which were heated at 550 ° C. with a Se flow rate of 30 or 45 Å/s/ showed the best results.

Analyses of the morphology of films obtained from precursor type (d) prepared under a Se flux that was two times (2×) the total metal flux found that the films tended to be porous and consisted of very small grains.

Figure 11:
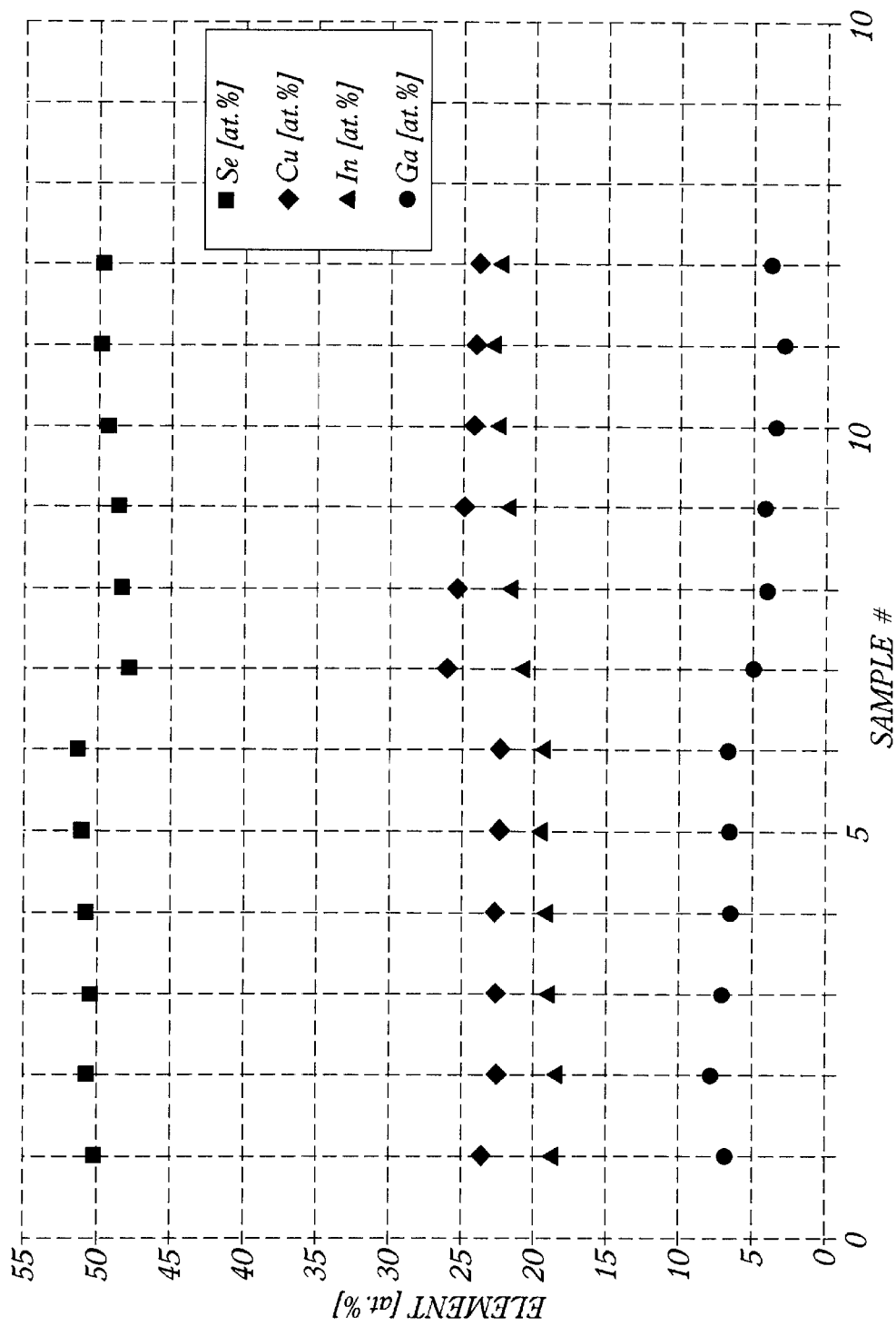
FIG. 11 is a graph showing the compositional analyses of various CIGS films after heating at 550° C. for 20 minutes of various CIGS precursors deposited onto unheated substrates.

FIG. 11 summarizes the results of the compositional analyses of CIGS films obtained after selenization at 550° C. for 20 minutes of precursor types (d) and (f) deposited onto unheated substrates at various Se flux rates. Samples 1–3 and 4–6 were type (d) and type (f) precursors, respectively, deposited with a Se flux rate that was 1× the total metal flux, and samples 7–9 and 10–12 were type (d) and type (f) precursors, respectively, deposited with a Se flux rate that was 0.5× the total metal flux. For each group of samples, (i.e., 1–3, 4–6, 7–9, and 10–12), the Se rate during the selenization step was 15, 30, and 45 Ås/, respectively. The compositional analysis summarized in FIG. 11 revealed no measurable dependence on the Se concentration of the precursor with respect to the amount of Se evaporated during the selenization step. However, it can be clearly seen in FIG. 11 that the precursor structures deficient in Se (i.e., Se flux=0.5× total metal flux) (runs 7–9 and 10–12) resulted in slightly Se deficient CIGS with 48–49 at. % Se, while precursors of approximately 50 at. % Se (runs 1–3 and 4–6) yielded a Se concentration in the 50 to 51.5 at. % range in the final film.

Since an excess of Se in the precursor had no beneficial effects, but rather limited the morphology, further experiments were carried out using Se fluxes equal to one times (1×) and one half (0.5×) the total metal flux, resulting in precursors of approximately 50 at. % and 40 at. % Se, respectively. These experiments were performed for the precursor structure type (d) (In-Se/Cu-Ga-Se) and type (f) (In-Se/In-Cu-Ga-Se).

Subsequent thermal treatment of these precursors was done at 550° C. for 20 min employing a heat rate of 300° C./min and a Se rate of 15, 30, and 45 Ås/. Structural analysis of these samples showed them all to be single phase CIGS independent of the precursor layer structure and Se flux during selenization.

Figure 12:
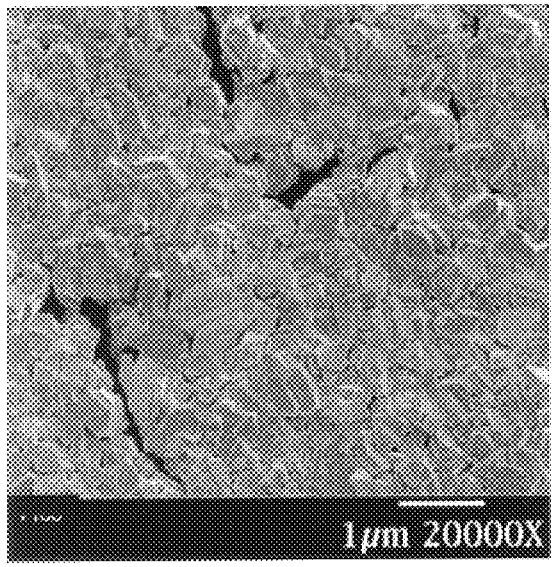
FIGS. 12–15 are SEM images of CIGS films obtained after heating various precursor structures which had been deposited onto an unheated substrate under a Se flux=1× the total metal flux.
Figure 13:
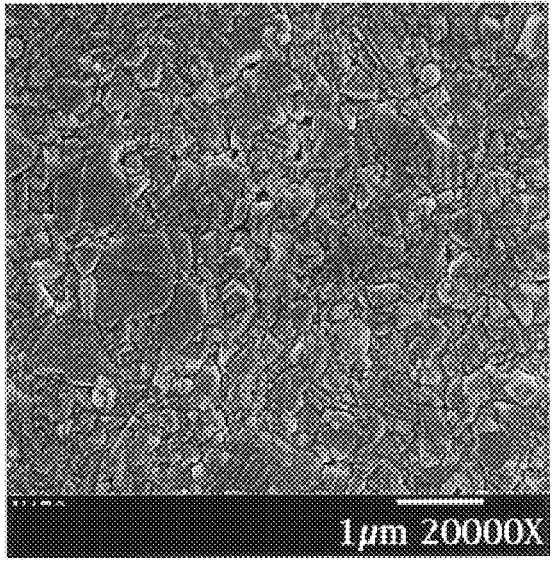
Figure 14:
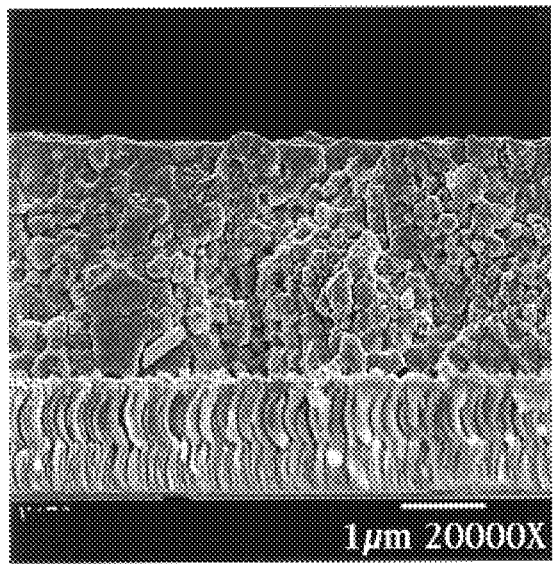
Figure 15:
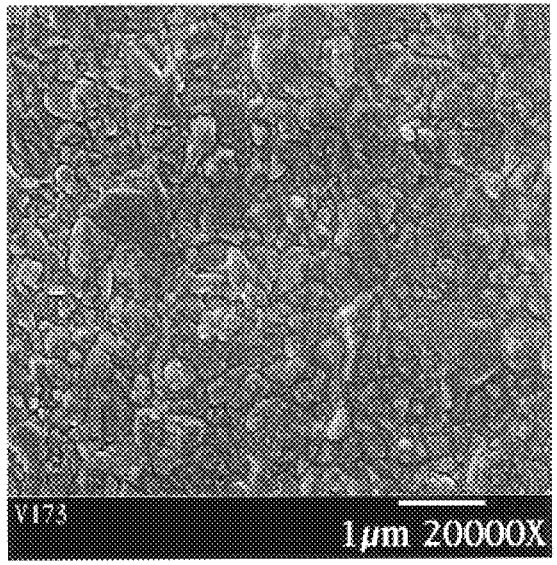

FIGS. 12–15 are SEM images of films obtained from precursor structure types (d) and type (f) deposited onto an unheated substrate under a Se flux equal to one times (1×) the total metal flux, and subsequently heated at 550° C. with a Se flow rate of 30 or 45 Ås/. FIGS. 12–15 indicate that the final film morphology showed a dependence on the precursor layer structure for the CIGS samples obtained using the Cu:Ga sputter target. FIGS. 13 and 15 show that films obtained from precursor structure type (f) (In-Se/In-Cu-Ga-Se) resulted in better morphologies than the conversions of precursor type (d) (In-Se/Cu-Ga-Se) (FIG. 12). Further, the grain size seemed to be limited, which may be due to a lessened $Cu_xSe$ assisted growth mechanism. Although films converted from precursors of type (f) resulted in better morphologies than those from precursors of type (d), no change in grain size was observed.

Examination of film thickness change revealed no measurable change for precursors deposited at a Se flux equal to 1× the total metal flux and subsequently selenized at 550° C. for 20 min under a Se overpressure at 15, 30 or 45 Ås/. In addition, the films produced from precursors having In-Se as the first layer had better film adhesion than films produced from precursors having Cu-Ga-Se as the first layer. The fact that no excess of Se is needed in the precursor demonstrates an economical advantage over other methods in the art for preparing CIGS, since less material is required.

EXAMPLE 3

CIGS Films Prepared by Sputtering a Cu Target and Co-evaporating Ga and Se

Semiconductor devices prepared in this example were prepared as described in Example 2, with the exception that the Ga incorporation into the film was separated from the Cu delivery by sputtering a Cu target instead of a Cu:Ga target and simultaneously evaporating Ga from a tungsten boat and Se from a molybdenum boat. The precursor structures prepared and studied are type (i)-(m) listed in Table 6.

(a) In a first experiment, precursors of type (i)-(k) were prepared comprising only a very small portion of Ga (approximately 3%) to investigate the influence of Ga on the formation chemistry, while changes to the electronic properties of the absorber should remain negligible.

Compositional analysis (obtained by EPMA) of CIGS films prepared from precursor structure types (i)-(m) at various annealing/recrystallization temperatures (T) are summarized in Table 7. An increase in Ga content was observed with an increase in temperature (T). A more detailed investigation of the elemental distribution via AES depth profiling revealed that this increase in Ga content was due to a recrystallization temperature dependent shift in the Ga distribution throughout the film thickness. All films studied by AES showed a peak in the Ga content at approximately half the film thickness. Thus, the location of the maximum Ga concentration roughly corresponded to the thickness at which Ga was introduced in the precursor layer sequence, indicating a reduced Ga mobility. As the temperature (T) was increased from 420 to 550° C., more Ga diffused towards the front and back of the films, thus accounting for a slight increase in the Ga count in the EPMA analysis.

As for the elemental distribution of Cu, In, and Se, these elements were found to be uniform throughout the film thickness, with only a slight decrease at the location of the Ga peak. In addition, a slight increase in the In content was observed at the back of the films due to the fact that all precursors started with an In-Se layer deposited onto the Mo back electrode.

Structural analysis of films converted from precursors of type (j) (In-Se/Ga-Se/In-Cu-Se) and type (k) (In-Se/Ga-Se/Cu-Se/In-Se) revealed single phase CIGS for all annealing/recrystallization temperatures examined. The XRD spectra of films obtained from precursor structures of type (i) (In-Se/Ga-Se/Cu-Se), on the other hand, contained an $\alpha$-$Cu_2Se$ (261) reflection at 2.46 Å. As the annealing/recrystallization temperature for the type (i) precursor was increased, the intensity of this secondary phase reflection decreased.

When comparing device performance of the above devices, where about 3% of the In was replaced by Ga, to the related CIS-only devices (i.e., comparing type (c) to type (i), type (e) to type (j), or type (g) to type (k)) it was found that the type (i),(j) and (k) devices differed in their $V_{oc}$ to annealing/recrystallization temperature, T, dependence. That is, while the CIS-only film types (c), (e) and (g) showed a clear increase in $V_{oc}$ as T was decreased to T=420° C., the low Ga-containing film types (i), (j) and (k) exhibited the lowest $V_{oc}$ values for T=500° C.

Figure 16:
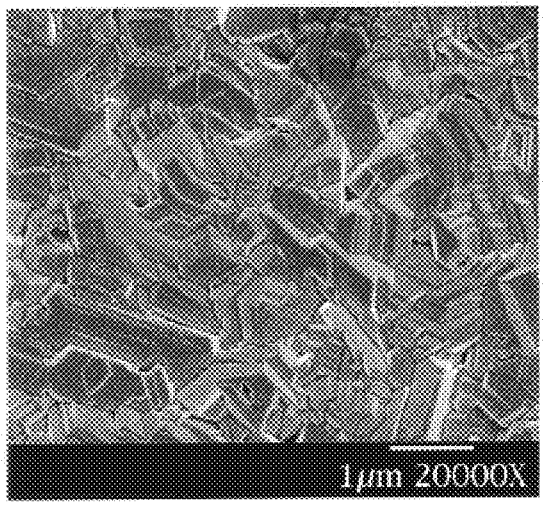
FIGS. 16 and 17 are SEM micrographs of CIGS prepared from an In-Se/Ga-Se/Cu-Se precursor treated at 550° C. for 20 minutes under 30 Ås/ Se.
Figure 17:
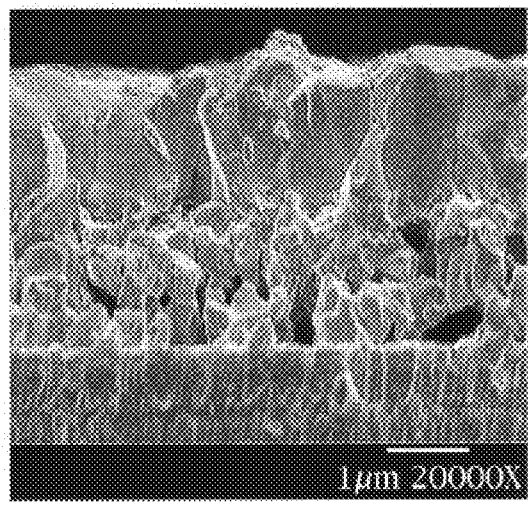
Figure 18:
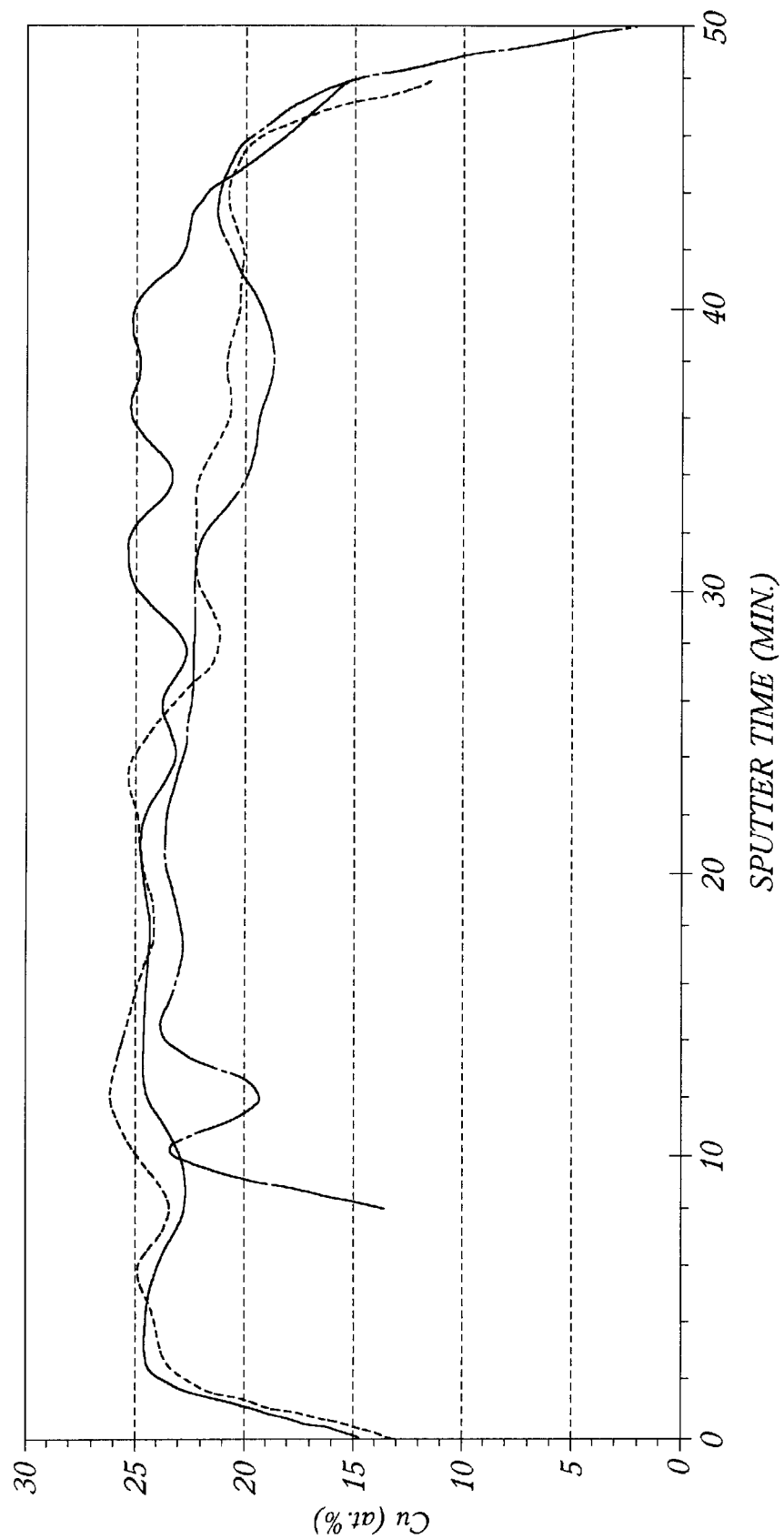
FIGS. 18–21 are AES depth profiles of $CuIn_{0.75}Ga_{0.25}Se_2$ as a function of annealing/recrystallization temperatures. The graphs in FIGS. 18, 19, 20, and 21 are shown as atomic percent of Cu, Ga, In, and Se, respectively, versus sputter time. The uneven dashed curves represent a heating temperature of 420° C., the even dashed curves represent a heating temperature of 500° C., and the solid curves represent a heating temperature of 550° C.
Figure 19:
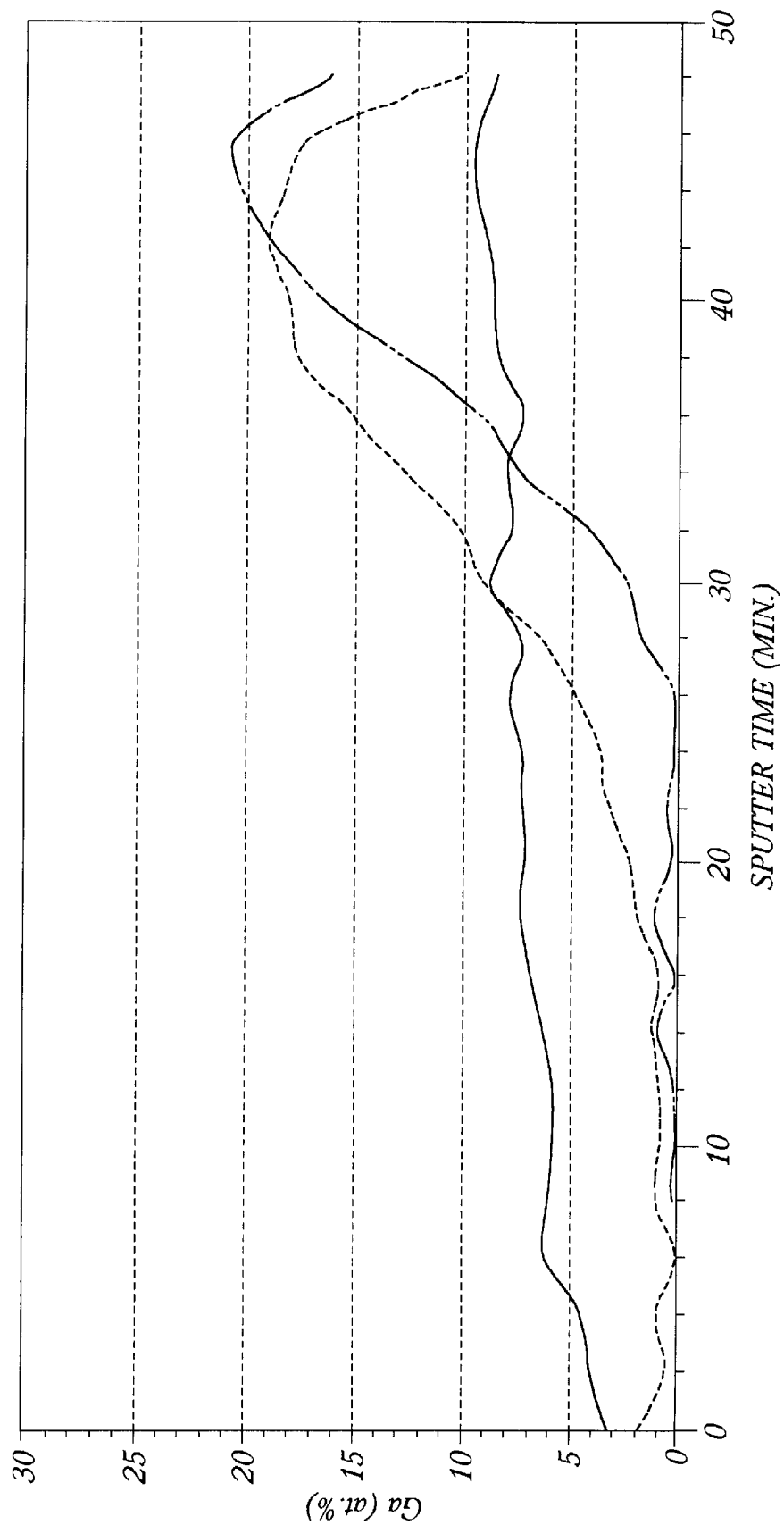
Figure 20:
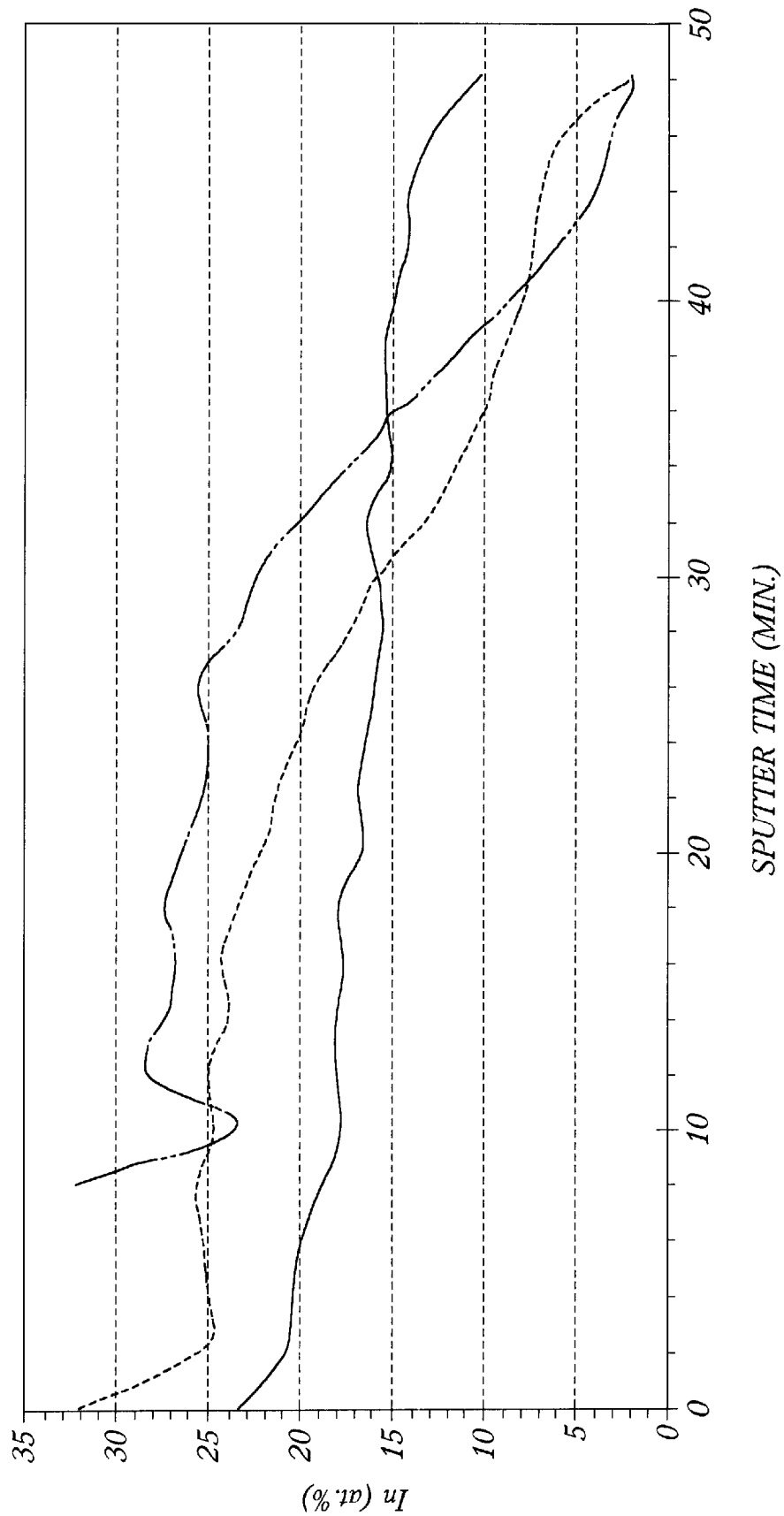
Figure 21:
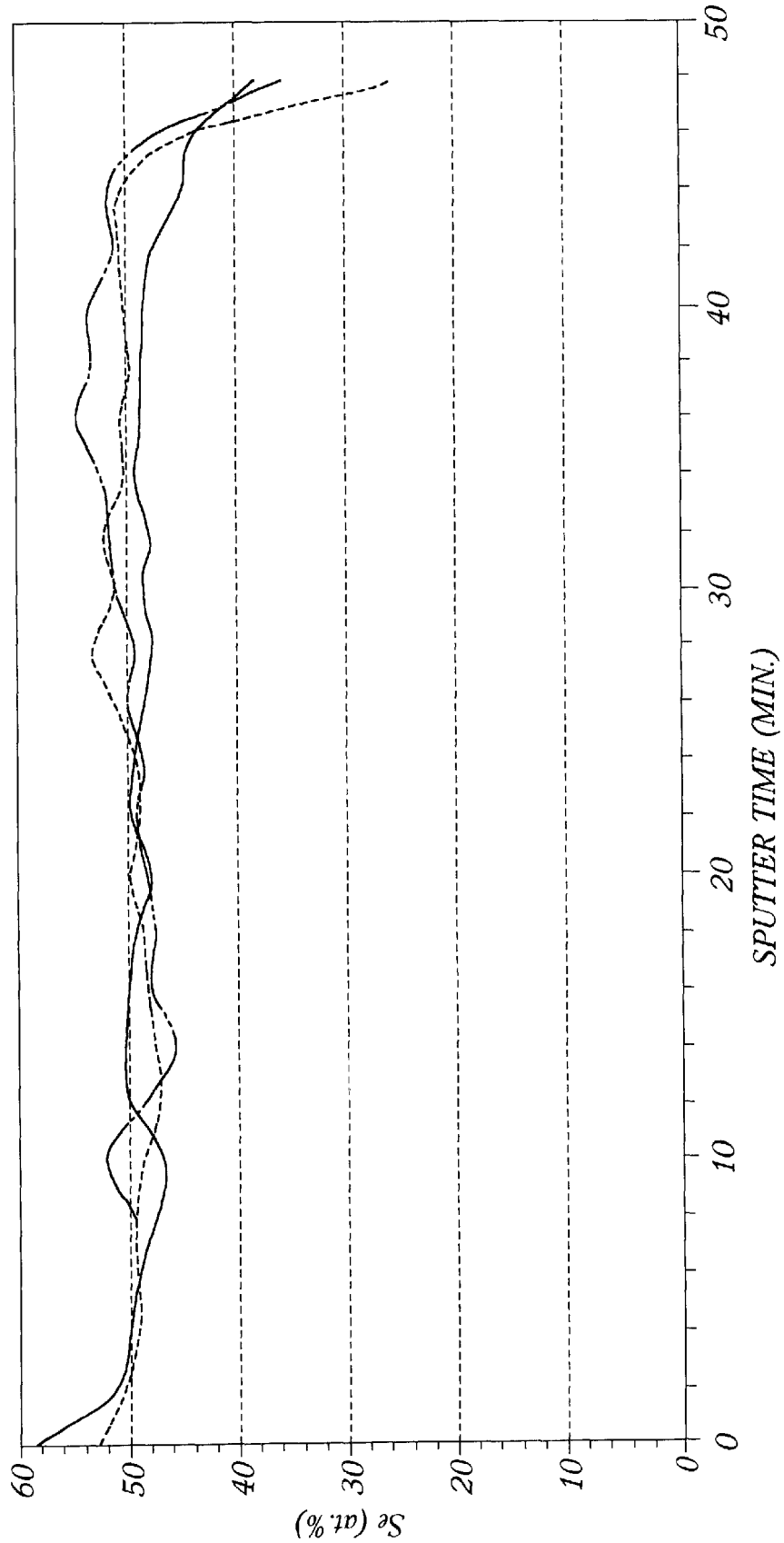

FIGS. 16 and 17 show a cross-sectional view and a surface scan, respectively, of a SEM image of a film prepared from a precursor type (i) (In-Se/Ga-Se/Cu-Se) comprising about 3% Ga after heating at 550° C. for 20 minutes under 30 Ås/ Se. As can be seen from FIGS. 16 and 17, a small amount of Ga (approximately 3%) introduced separate from the Cu delivery does not alter the growth mechanism. That is, the use of a Cu:Ga target resulted in small grains, which CIS gave large grains (see FIG. 4). Thus, FIG. 4 and FIG. 16 show similar film structures indicating that the presence of Ga did not contribute to the poorer film morphologies when the Ga delivery was separated from the Cu deposition.

The above results indicate that the introduction of a small amount of Ga into the precursor structures as a Ga-Se layer does not alter the underlying growth mechanism that was observed for the CIS-only cases.

(b) In a second set of experiments, the Ga content in the precursor was increased to approximately 25% to allow for a better comparison to the CIGS material obtained using the Cu:Ga sputter target. In these experiments, Ga incorporation was also further isolated from Cu in the precursor by employing precursor structures of type (l) (In-Se/Ga-Se/In-Se/Cu-Se) and type (m) (Ga-Se/In-Se/Cu-Se). It should be noted that no adhesion problems were observed for devices prepared from type (m) precursors having Ga-Se as the first layer.

Inductively coupled plasma spectroscopy (ICP) analysis of the precursor types (l) and (m) showed them to contain 25±1% Ga, and electron probe microanalysis (EPMA) analysis of the films showed an increase in Ga counts with an increase in annealing/recrystallization temperature.

FIGS. 18–21 show the Auger electron spectroscopy (AES) depth profiles for the CIGS films having the composition $CuIn_{0.75}Ga_{0.25}Se_2$ obtained from precursors of type (m) (Ga-Se/In-Se/Cu-Se) deposited onto unheated substrates and after treatment at 420° C., 500° C., or 550° C. for 20 minutes under 30 Å/s/Se. While the Cu and Se content were constant throughout the film thickness for all the examined annealing/recrystallization temperatures (T), variations in the In and Ga concentration were evident. At a temperature of T=420° C. (uneven dashed curves in FIGS. 18–21), almost all the Ga was concentrated at the back of the sample. As the temperature T was increased to 500° C. (even dashed curves in FIGS. 18–21), the Ga started to spread further towards the front of the film, and at T=550° C. (solid curves in FIGS. 18–21) the Ga was present throughout the total thickness of the film with a slight increase in Ga towards the back electrode. This graded Ga distribution should enhance the device parameters due to an associated increase in the band gap towards the back electrode. As for the In distribution, it displayed a profile opposite to that of Ga.

Similar to the results described in Example 2 for the CIGS material obtained using the Cu:Ga sputter target, structural analysis of the CIGS samples containing about 25% Ga revealed a temperature dependent phase behavior during the annealing/recrystallization of the precursor types (i)-(m). Precursors treated at 420° C. and 500° C. consisted of $CuInSe_2$ and $CuIn_xGa_{1-x}Se_2$, $x \geq 0.5$, while the material obtained from selenizations at 550° C. was single phase CIGS.

Figures 22, 23, 24:
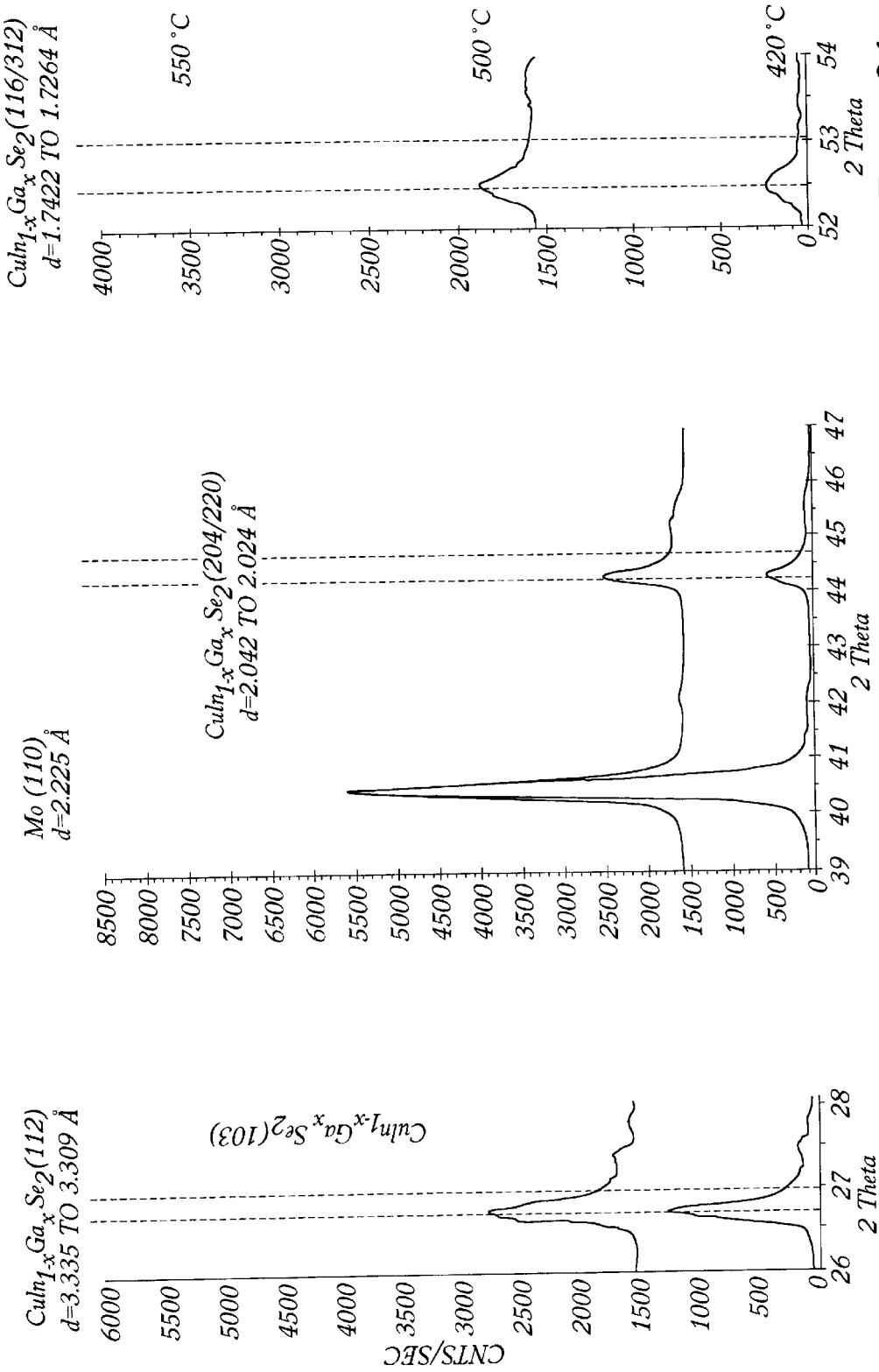
FIGS. 22–24 are XRD analyses of CIGS films obtained from Ga-Se/In-Se/Cu-Se precursors illustrating phase behavior as a function of heating temperature. Curve (a) in FIGS. 22–24 represents an heating temperature of 420° C., curve (b) in FIGS. 22–24 represents a heating temperature of 500° C., and curve (c) in FIGS. 22–24 represents a heating temperature of 550° C.
Figure 25:
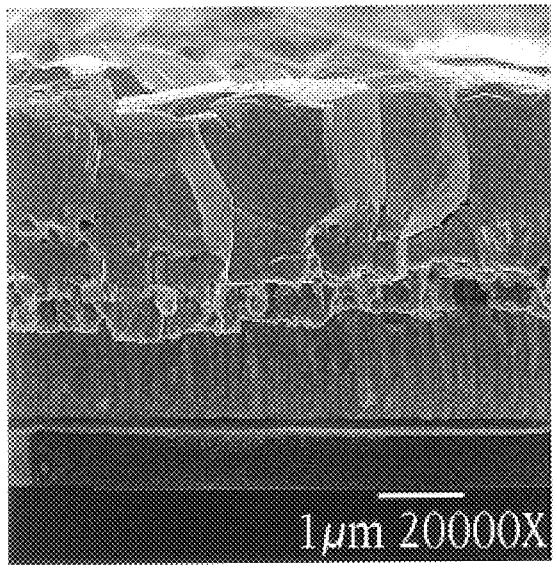
FIGS. 25–28 are SEM cross-sectional view and surface scan micrographs of CIGS films prepared from precursor structures of In-Se/Ga-Se/In-Se/Cu-Se (FIGS. 25 and 26) and Ga-Se/In-Se/Cu-Se (FIGS. 27 and 28) after treatment at 550° C. for 20 minutes at a heat rate of 300° C. and under a Se rate of 30Ås/.
Figure 26:
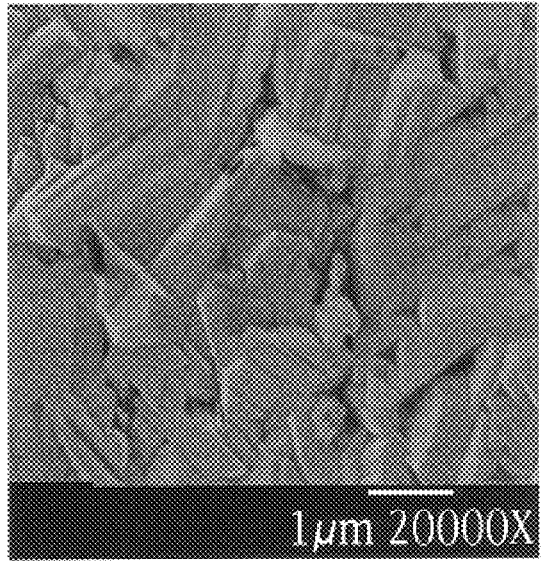
Figure 27:
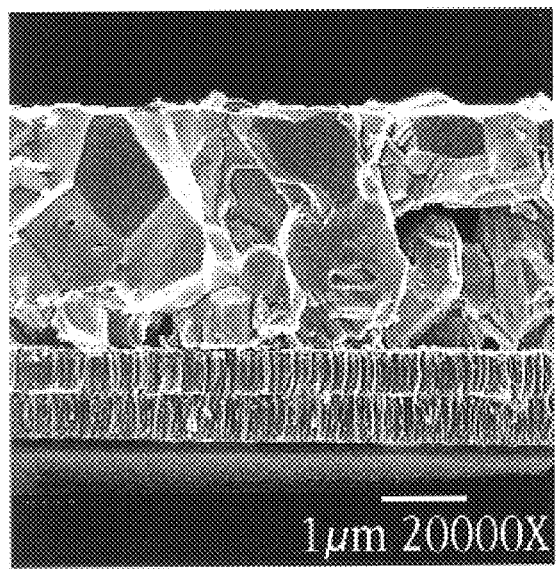
Figure 28:
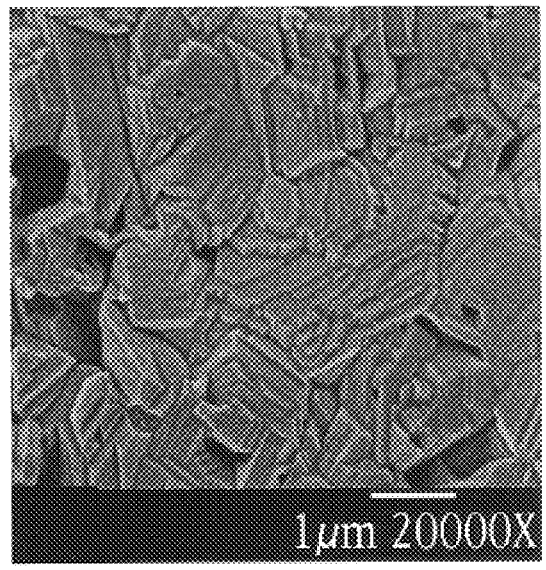

FIGS. 22–24 are XRD spectra of films obtained from Ga-Se/In-Se/Cu-Se precursor type (m) annealed at 420° C., 500° C., or 550° C. As can be seen from FIGS. 22–24, the CIGS reflections (112, 204/220, and 116/312) in the XRD spectra were shifted towards larger 2 theta values as the annealing temperature T was increased, while the reflections arising from the Mo back electrode remain at constant 2 theta values. The latter shift of the CIGS reflections is in accordance with a decrease in lattice parameters associated with an increase in Ga content in the quaternary CIGS system, and fits well with the AES depth profiles.

Grain size of the CIGS showed a temperature dependence where the growth of large grains extended deeper into the film from the Cu-Se rich surface layer of the precursor as the annealing T was increased. The SEM micrographs in FIGS. 25–28 illustrate the excellent film morphology (i.e., smooth, dense films consisting of large grains) that resulted for films obtained by thermal treatment of precursor structures of type (l) (FIGS. 25 and 26) and type (m) (FIGS. 27 and 28) at a rate of 300° C./min, then 550° C. for 20 minutes under a Se rate of 30 Å/s/.

Table 8 summarizes the device performance for CIGS prepared from precursor structure types (i)-(m) at various annealing conditions. Structures (i),(j), and (k) in Table 8 were prepared with 3% Ga, while structures (l) and (m) were prepared with 25% Ga. The total area of each device was 0.43 cm$^2$, and no AR-coating was employed. All devices measured showed good diode characteristics, with large $R_{sh}$ and low $R_s$ values.

Figure 29:
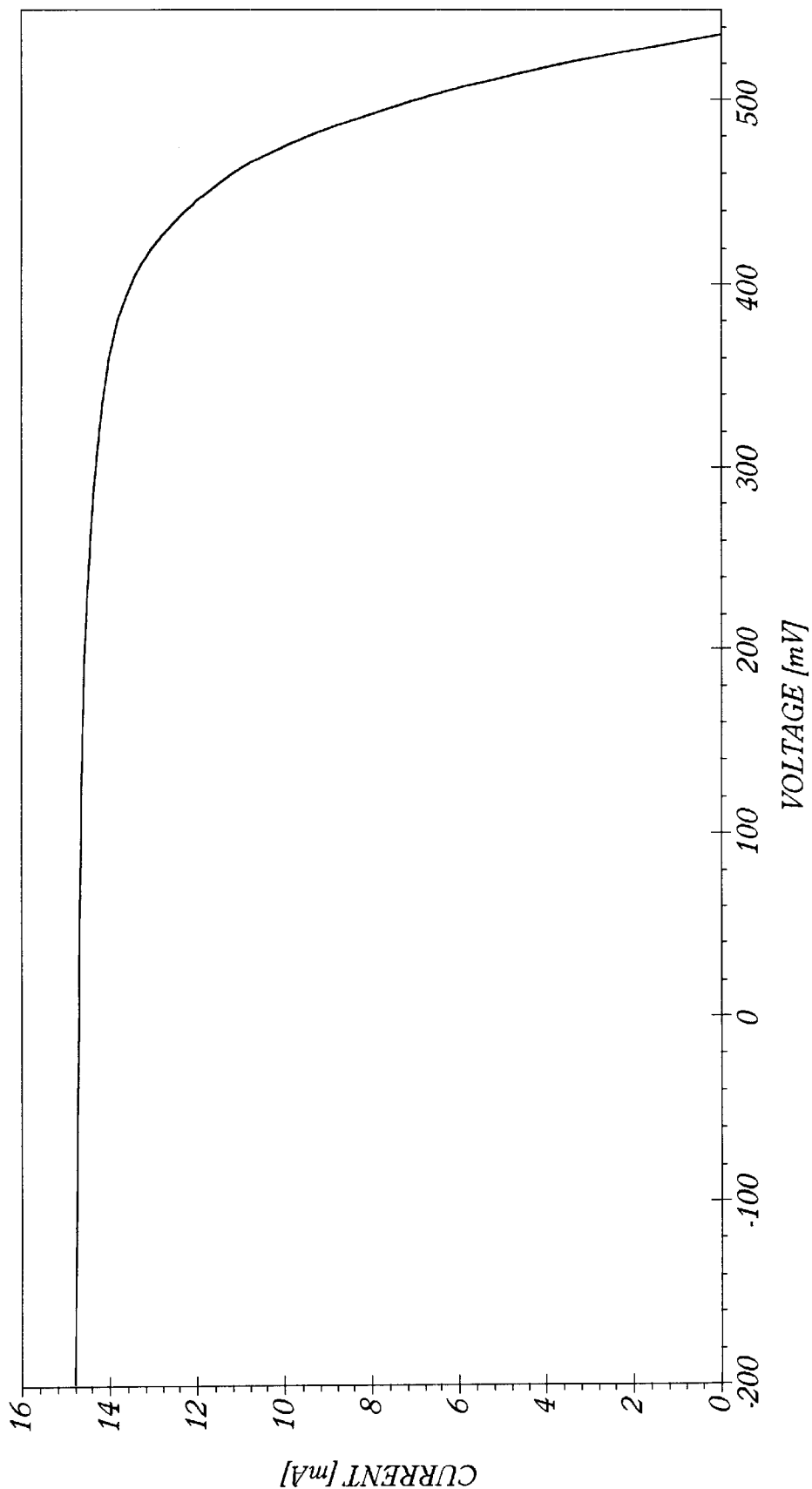
FIG. 29 is current voltage curve of a CuIn$_{0.75}$Ga$_{0.25}$Se$_2$ absorber.
Figure 30:
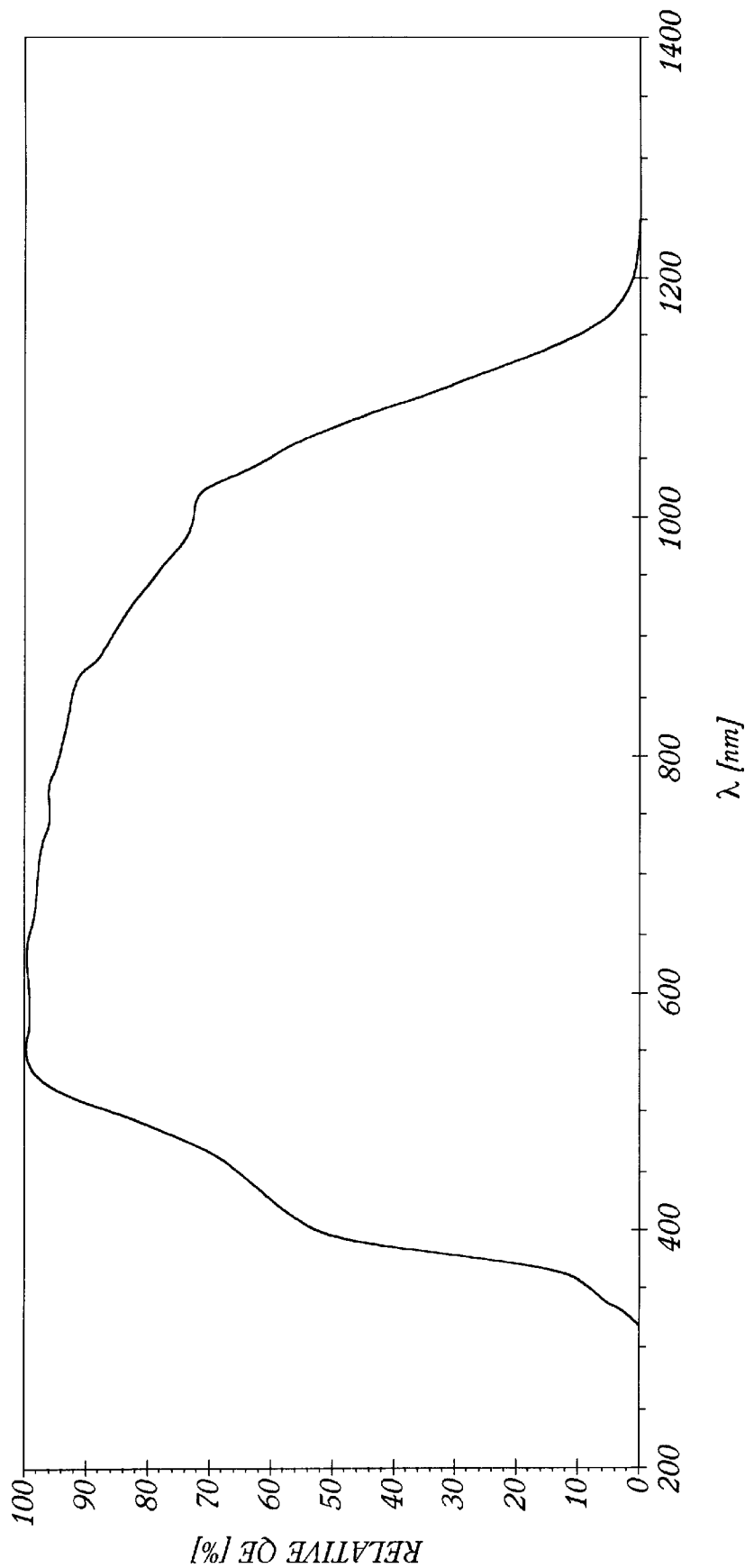
FIG. 30 is a quantum-efficiency curve of a CuIn$_{0.75}$Ga$_{0.25}$Se$_2$ absorber at 10 mA light bias, shown as percent relative QE versus wavelength (nm).

Surprisingly, the highest device efficiencies (i.e., up to 11.4%) were obtained from low Ga-containing CIGS precursor structures converted at 420° C., as was the case for the CIS-only material. Also, the measured $V_{oc}$ values were only slightly larger than those of the CIS-only devices. These trends changed when the Ga content in the films was increased to about 25%, showing an increase in $V_{oc}$ and device efficiency as T was increased. For example, $CuIn_{0.75}Ga_{0.25}Se_2$ devices prepared according to the method of the invention by sputtering Cu and evaporating Ga resulted in efficiencies of up to 12%. Thus, when increasing the Ga content to about 25%, the amount of Ga does affect the recrystallization and hence the electronic properties of the films. Therefore, higher temperatures (e.g., 550° C.), were required to obtain single phase material and maximum device performance. At T=550° C. an open-circuit voltage of 537 mV indicated that Ga actively influences the electronic properties of the material, although this value is still lower than expected for devices with about 25% Ga. The device was then covered with an AR-coating, which resulted in an increase in $J_{sc}$ boosting the total-area conversion efficiency to 13%. The official I–V and QE curves and data are given in FIGS. 29 and 30.

EXAMPLE 4

Modification of Deposition Equipment and Targets

Modifications were made to conventional deposition equipment with a particular emphasis on avoiding Se poisoning of the sputter targets. It was observed that when using conventional sputtering devices, the In sputter target suffered from substantial Se poisoning while the Cu-Se layer was being deposited. Only slight Se poisoning of the In target was observed when sputtering In in the presence of Se, where the degree of Se poisoning of the In increased with a decrease in DC sputter power, and thus sputter rate. The resulting formation of InSe on the surface of the Se poisoned In target can lead to a drastic increase in target resistance. This in turn results in a decrease of the In deposition rate at a given DC power level, and increased target temperature.

Since control over the metal deposition rate in the presence of Se is based on calibration of DC power versus metal deposition rate (due to the absence of optical rate monitors), Se poisoning of the In target needs to be avoided if constant and reproducible rates, and thus, film compositions, are to be obtained. Further, as a result of Se poisoning and In-selenide formation, additional thermal losses of the DC power into the target affect not only the In sputter rate, but due to the already low melting point of In ($T_{m\ (In)}$=) 156.6° C. ), sufficient target cooling is essential in order to avoid possible target meltdown or In evaporation off the target surface. Thus, at high sputter rates the In-target becomes unstable and can suddenly melt, resulting in target loss.

Se poisoning of Cu and Cu/Ga targets was found to pose an almost negligible problem, since Cu-selenides are still sufficiently conductive as not to affect the sputter rate in the DC-mode too much. However, once the target surface has been covered with a Cu-selenide layer, it is necessary to first clean the surface by sputtering for a certain period of time. The latter has to do with the fact that the rate calibration is based on pure Cu being sputtered at a given rate and DC power. If Cu-selenides have formed on the target surface, the material sputtered initially will not be pure Cu, but Cu-selenide, thus, affecting the actually deposited amount of Cu. Consequently, avoiding Se poisoning of the metal targets is preferable if constant and reproducible deposition rates—and, thus, film compositions—are to be obtained.

The prevention of target poisoning by Se was addressed in three ways:

Modifying the deposition chamber assembly by (a) installing extended ground shields on the sputter guns, resulting in a larger dark space region, (b) placing individual tight fitting shutters above the targets, and (c) positioning direct sputter gas (i.e., Ar) inlets above the target surface. In this way the target is almost completely encapsulated, and therefore is not exposed to the Se containing atmosphere, when the target is not being used. This measure by itself proved to be effective and showed a dramatic reduction in Se poisoning of targets while the targets were not in use. In addition, during sputter deposition the extended ground shield in combination with the direct sputter gas inlet above the target surface resulted in a very confined plasma region that did not allow Se penetration, and thus prevented Se poisoning during the operation of the gun. Also, the modified sputter gas inlet resulted in a higher and more uniform gas density above the targets.

Optimizing the relative spatial orientation of the sources in combination with the chamber aerodynamics. Se-vapor behaves like a gas, and thus has the tendency to spread all over the deposition chamber. However, the inventors discovered that Se could be confined mainly to an area close to the substrate by placing the Se source close to the substrate at a given tilt angle and away from the lower positioned metal sources. Another important aspect in choosing the location of the Se source was that it needed to be selected in such a way as to achieve a uniform Se concentration over the total substrate area. Only in this way could a homogeneous Se distribution be obtained in the deposited material and over the whole substrate area.

The Se distribution also was a function of the chamber aerodynamics. The location of the chamber outlet leading to the vacuum pumping system at the top of the deposition chamber in combination with two "exhaust slots" at the front and back of the substrate tray resulted in most of the Se being retained in the upper half of the deposition chamber, i.e., mostly above the metal sources.

After these two modifications in combination with the measures discussed under paragraph 1 of this example, no Se poisoning was observed at the sputter targets when they were idle or active in a Se containing atmosphere. However, as for the In-target a further modification was made which was mainly done as an additional safety measure.

Using modified In-targets. Since an In-target melt down upon heating the In target was to be avoided, a more efficient way of cooling the target at high DC power was desirable. This was achieved by making a cup out of Cu and filling it with In via a vacuum melt process. The vacuum melt process consisted of filling the Cu-cup with In ingots (99.995% purity; The Indium Corporation of America) and slowly heating in vacuum to a temperature >$T_{m(In)}$. After about 10 minutes the target was allowed to slowly cool down to room temperature. This process ensured dense In-targets. In this way more of the In was in direct contact with the cooled Cu. Additional advantages lie in the fact that a bonding agent between the In and Cu cooling plate (as is the case for commercially available targets) is no longer necessary, and the exposed In surface is reduced to the top surface. In the present case circular In targets were employed due to the sputter guns being used in the system, but the concept applies to all target geometries.

EXAMPLE 5

Determination of PB-ratios for CIS and CIGS Films

The observed adhesion failure for the Cu-Ga-Se first precursors and the subsequent adhesion enhancement for In-Se first structures might be explained with a Pellings-Bedworth (PB) type model comparing the volume change for solid-to-solid reactions. To the inventors' knowledge, this is the first time the PB-ratio has been applied to the CIGS case. Assuming the coexistence of solid unreacted metal and solid unreacted Se in the precursors, and reactions of the type $$a A_{(s)} + b B_{(s)} \rightarrow c C_{(s)} + d D_{(s)}$$

the PB-ratio can then be expressed as:

$$PB_{ratio} = \frac{\sum_i v_i \left[\frac{M_i}{\rho_i}\right]_{product}}{\sum_i v_i \left[\frac{M_i}{\rho_i}\right]_{reactant}}$$

where i denotes the compound, $V_i$ is the stoichiometric coefficient of i, $M_i$ represents the molar mass of i in [g/mol], and $\rho_i$ is the density of i in [g/cm$^3$]. For example, the meaning of a PB-ratio of 2 is that if 1 cm$^3$ of reactants are reacted in their stoichiometric ratios they will form a total of 2 cm$^3$ of product(s).

Table 9 shows the PB-ratios obtained for the listed reactions. Assuming CI(G)S formation via binary selenides, examination of the PB-ratios reveals that the formation of In$_2$Se$_3$ from the elements results in only a negligible volume change (reaction 7 in Table 9). On the other hand, formation of CuSe$_2$—which is very likely in case of Se excess in the precursor—results in a substantial volume decrease (reaction 3 in Table 9). The associated stress results in adhesion failure to the Mo-coated substrate. If a Se-poor selenization of Cu occurs (i.e., formation of Cu$_2$Se) even more stress will result due to an almost two-fold volume increase, hence leading to adhesion failure (reaction 2 in Table 9). The PB-ratios for the remaining reactions listed in Table 9 indicate a small volume expansion resulting in an intermediate stress level. If the CI(G)S formation were a direct reaction of the individual elements to form the compound, no difference in adhesion should result according to this model. Thus, the above assumption of CI(G)S formation via binary selenides in conjunction with the PB-ratio model explains the observed adhesion artifacts. Also, it has been reported that when using a mixture of Cu, In, and Se powder and subjecting it to T=400° C. the only binaries observed were CuSe and Cu$_2$Se with elemental In and Se still present while no evidence for Cu$_x$In$_y$ could be found (see Baumgartner, R. P. et al., *E.C Photovoltaic Sol. Energy Conf., Proc. Int. Conf.*, (1994) 12:637. Treatment of the elemental powder mixture at 600° C. revealed Cu$_{2-x}$Se and In$_2$Se$_3$ to be present with a small amount of CIS; and at 700° C. single phase CIS was observed. Thus, this model of CIS formation from the elements via Cu$_{2-x}$Se and In$_2$Se$_3$ supports the above assumption.

Further supportive results were obtained by examination of film thickness changes upon selenization. These analyses revealed no measurable change for precursors deposited at Se fluxes=1× the total metal flux (i.e., approximately 50 at. % Se) and subsequent selenization at 550° C., 20 min at 15, 30, 45 Å/s/ Se. As was to be expected, selenization of precursors that were Se deficient or showed an excess of Se resulted in a small thickness increase (approximately 1.4×) or decrease (approximately 0.8×), respectively.

A novel two-stage pathway toward the formation of CI(G)S has been demonstrated in the present invention, resulting in high quality CIS and CIGS material. Photovoltaic devices based on these absorbers yielded total-area conversion efficiencies of 10 and 13%, respectively. CIS films prepared by sputtering an In target while simultaneously evaporating Se to form an In-Se layer on an unheated substrate, followed by sputtering a Cu target while simultaneously evaporating selenium to form a Cu-Se layer on the In-Se layer, and subsequently heating the In-Se/Cu-Se precursor at 420–°550° C. for 10–30 minutes, and preferably for 20 minutes, provide for single-phase semiconductor $CuInSe_2$ film without the need to expose the precursor to a reactive gas of Cu or In during the annealing or recrystallization step. The films produced by the two-stage process of this invention do not suffer from poor adhesion to the substrate, because no change in thickness occurs during conversion of the precursor to the semiconductor material.

The foregoing description is considered as illustrative only of the principles of this invention. Further, since numerous modifications and changes will readily occur to those skilled in the art, it is not desired to limit the invention to the exact construction and process shown as described above. Accordingly, all suitable modifications and equivalents may be resorted to falling within the scope of the invention as defined by the claims that follow.

The words "comprise," "comprising", "include," "including," and "includes," when used in this specification and in the following claims, are intended to specify the presence of stated features, integers, components, or steps, but they do not preclude the presence or addition of one or more other features, integers, components, steps, or groups thereof.

TABLE 1

| Precursor type | Precursor layer structure | Relative amount of total In deposited in the In stages (%) |
|---|---|---|
| (a) | Cu—Se/In—Se | 100 |
| (c) | In—Se/Cu—Se | 100 |
| (e) | In—Se/In—Cu—Se | 73/27 |
| (g) | In—Se/Cu—Se/In—Se | 90/10 |
| (h) | In—Se/In—Cu—Se/In—Se | 63/27/10 |

TABLE 2

| Precursor | Selenization | | | | Composition | | | | |
| | T (° C.) | t (min) | Heat rate (° C./min.) | Se rate (Å/s) | Cu (at. %) | In (at. %) | Se (at. %) | Cu/In | (Cu + In)/Se |
|---|---|---|---|---|---|---|---|---|---|
| In—Se/Cu—Se | 550 | 20 | 300 | 15 | 24.96 | 25.14 | 49.90 | 0.993 | 1.004 |
| | | | | 30 | 23.95 | 25.69 | 50.36 | 0.932 | 0.986 |
| | | | | 45 | 23.84 | 25.66 | 50.50 | 0.929 | 0.980 |
| | | | | 15 | 24.71 | 25.15 | 50.14 | 0.983 | 0.994 |
| | 550 | 20 | 300 | 30 | 23.96 | 25.68 | 50.36 | 0.933 | 0.986 |
| | | | | 45 | 23.81 | 26.06 | 50.13 | 0.914 | 0.995 |
| In—Se/In—Cu—Se | 550 | 20 | 100 | 30 | 22.66 | 26.31 | 51.03 | 0.862 | 0.960 |
| | | 40 | | | 22.02 | 26.72 | 51.26 | 0.824 | 0.951 |
| | | 60 | | | 22.51 | 26.32 | 51.17 | 0.855 | 0.954 |
| | | 20 | 200 | | 24.26 | 25.36 | 50.38 | 0.957 | 0.985 |
| | | 40 | | | 23.55 | 25.82 | 50.63 | 0.912 | 0.975 |
| | | 60 | | | 23.49 | 25.90 | 50.61 | 0.907 | 0.976 |
| | | 20 | 300 | | 24.51 | 25.72 | 49.77 | 0.953 | 1.009 |
| | | 40 | | | 23.68 | 26.00 | 50.32 | 0.911 | 0.987 |
| | | 60 | | | 23.97 | 25.71 | 50.32 | 0.932 | 0.987 |
| In—Se/Cu—Se/In—Se | 550 | 20 | 100 | 30 | 24.27 | 25.98 | 49.75 | 0.934 | 1.010 |
| | | | 200 | | 23.90 | 25.78 | 50.32 | 0.927 | 0.987 |
| | | | 300 | | 24.11 | 25.63 | 50.26 | 0.941 | 0.990 |
| In—Se/In—Cu—Se/In—Se | 550 | 20 | 100 | 30 | 22.44 | 26.78 | 50.78 | 0.838 | 0.969 |
| | | | 200 | | 22.42 | 26.51 | 51.07 | 0.846 | 0.958 |
| | | | 300 | | 22.28 | 26.50 | 51.22 | 0.841 | 0.952 |
| | 420 | 20 | 300 | 30 | 22.62 | 26.40 | 50.98 | 0.857 | 0.962 |
| | 500 | | | | 22.32 | 26.50 | 51.18 | 0.842 | 0.954 |
| | 550 | | | | 22.26 | 26.56 | 51.18 | 0.838 | 0.954 |
| In—Se/Cu—Se | 420 | 20 | 300 | 30 | 22.66 | 26.43 | 50.91 | 0.857 | 0.964 |
| | 500 | | | | 22.83 | 26.56 | 50.61 | 0.860 | 0.976 |
| | 550 | | | | 23.56 | 26.06 | 50.37 | 0.904 | 0.985 |
| In—Se/In—Cu—Se | 420 | 20 | 300 | 30 | 21.73 | 27.30 | 50.97 | 0.796 | 0.962 |
| | 500 | | | | 21.91 | 27.08 | 51.01 | 0.809 | 0.960 |
| | 550 | | | | 22.50 | 26.71 | 50.79 | 0.842 | 0.969 |
| In—Se/Cu—Se/In—Se | 420 | 20 | 300 | 30 | 21.86 | 27.30 | 50.84 | 0.801 | 0.967 |
| | 500 | | | | 21.55 | 27.37 | 51.08 | 0.787 | 0.958 |
| | 550 | | | | 22.40 | 27.06 | 50.54 | 0.828 | 0.979 |

TABLE 3

| Precursor | Selenization | | | | Device parameters | | | |
|---|---|---|---|---|---|---|---|---|
| | T (° C.) | t (min) | Heat rate (° C./min.) | Se rate (Å/s) | $V_{oc}$ (mV) | $J_{sc}$ (mA/cm$^2$) | FF (%) | η (%) |
| In—Se/Cu—Se | 550 | 20 | 300 | 15 | 345 | 28.77 | 53.56 | 5.32 |
| | | | | 30 | 397 | 32.47 | 66.12 | 8.53 |
| | | | | 45 | 367 | 32.57 | 63.90 | 8.07 |
| | | | | 15 | 375 | 31.70 | 59.03 | 6.98 |
| | 550 | 20 | 300 | 30 | 383 | 29.65 | 56.94 | 6.70 |
| | | | | 45 | 407 | 34.77 | 66.95 | 9.48 |
| In—Se/In—Cu—Se | 550 | 20 | 100 | 30 | 408 | 29.03 | 67.17 | 7.96 |
| | | 40 | | | 405 | 27.44 | 67.62 | 7.52 |
| | | 60 | | | 407 | 27.02 | 67.68 | 7.44 |
| | | 20 | 200 | | 400 | 29.38 | 67.32 | 7.91 |
| | | 40 | | | 401 | 31.00 | 65.94 | 8.20 |
| | | 60 | | | 393 | 32.75 | 64.47 | 8.29 |
| | | 20 | 300 | | 403 | 30.77 | 67.52 | 8.44 |
| | | 40 | | | 408 | 30.62 | 66.19 | 8.27 |
| | | 60 | | | 374 | 32.09 | 59.97 | 7.19 |
| In—Se/Cu—Se/In—Se | 550 | 20 | 100 | 30 | 369 | 34.00 | 60.31 | 7.56 |
| | | | 200 | | 414 | 33.25 | 63.14 | 8.68 |
| | | | 300 | | 426 | 29.90 | 69.50 | 8.86 |
| In—Se/In—Cu—Se/In—Se | 550 | 20 | 100 | 30 | 406 | 33.03 | 67.74 | 9.08 |
| | | | 200 | | 414 | 26.05 | 67.59 | 7.30 |
| | | | 300 | | 409 | 28.33 | 66.72 | 7.74 |
| | 420 | 20 | 300 | 30 | 435 | 30.31 | 71.80 | 9.46 |
| | 500 | | | | 440 | 30.61 | 71.80 | 9.68 |
| | 550 | | | | 410 | 27.92 | 66.85 | 7.66 |
| In—Se/Cu—Se | 420 | 20 | 300 | 30 | 399 | 31.72 | 67.66 | 8.56 |
| | 500 | | | | 371 | 29.86 | 64.59 | 7.15 |
| | 550 | | | | 359 | 31.96 | 62.64 | 7.19 |
| In—Se/In—Cu—Se | 420 | 20 | 300 | 30 | 409 | 33.10 | 67.66 | 9.16 |
| | 500 | | | | 378 | 29.33 | 65.13 | 7.22 |
| | 550 | | | | 337 | 27.83 | 58.78 | 5.51 |
| In—Se/Cu—Se/In—Se | 420 | 20 | 300 | 30 | 425 | 31.60 | 69.29 | 9.30 |
| | 500 | | | | 363 | 29.32 | 63.19 | 6.73 |
| | 550 | | | | 344 | 29.65 | 60.22 | 6.13 |

TABLE 4

| Precursor type | Precursor layer structure | Relative amount of total In deposited in the In stages (%) |
|---|---|---|
| (b) | Cu—Ga—Se/In—Se | 100 |
| (d) | In—Se/Cu—Ga—Se | 100 |
| (f) | In—Se/In—Cu—Ga—Se | 42/58 |

TABLE 5

| (at. %) | (a) | (b) | (c) | (d) |
|---|---|---|---|---|
| Cu | 45.14 ± 0.39 | 44.39 ± 0.59 | 44.17 ± 0.01 | 45.32 ± 0.26 |
| In | 42.48 ± 0 0.33 | 43.19 ± 0.52 | 43.15 ± 0.09 | 42.05 ± 0.08 |
| Ga | 12.39 ± 0.12 | 12.41 ± 0.07 | 12.69 ± 0.10 | 12.63 ± 0.18 |
| Cu | 13.42 ± 0.36 | 22.05 ± 0.13 | 21.66 ± 0.07 | 22.24 ± 0.21 |
| In | 12.63 ± 0.21 | 21.46 ± 0.42 | 21.16 ± 0.03 | 20.64 ± 0.04 |
| Ga | 3.68 ± 0.06 | 6.17 ± 0.0.08 | 6.22 ± 0.07 | 6.20 ± 0.07 |
| Se | 70.26 ± 0.59 | 50.33 ± 0.36 | 50.95 ± 0.18 | 50.93 ± 0.18 |

(a) In—Se/Cu—Ga—Se precursor deposited at RT, Se flux = 2x total metal flux
(b) treatment of precursor at 300° C./min, 420° C. for 10 min, no Se
(c) treatment of precursor at 300° C./min, 420° C. for 10 min, 15 Å/s Se
(d) treatment of precursor at 300° C./min, 500° C. for 10 min, 15 Å/s Se

TABLE 6

| Precursor type | Precursor layer structure | Relative amount of total In deposited in the In stages (%) |
|---|---|---|
| (i) | In—Se/Ga—Se/Cu—Se | 100 |
| (j) | In—Se/Ga—Se/In—Cu—Se | 69/31 |
| (k) | In—Se/Ga—Se/Cu—Se/In—Se | 90/10 |
| (l) | In—Se/Ga—Se/In—Cu—Se | 50/50 |
| (m) | Ga—Se/In—Se/Cu—Se | 100 |

TABLE 7

Compositional analysis of CIGS as a function of temperature

| Precursor | Selenization (° C.) | Composition of CIGS | | | | | | | |
|---|---|---|---|---|---|---|---|---|---|
| | | Cu (at. %) | In (at. %) | Ga (at. %) | Se (at. %) | Cu/In | Cu/ (In + Ga) | Ga/ (In + Ga) | (Cu ± In ± Ga)/Se |
| (i) In—Se/Ga—Se/Cu—Se | 420 | 23.13 | 25.53 | 0.44 | 50.90 | 0.906 | 0.891 | 0.017 | 0.965 |
| | 500 | 23.64 | 25.18 | 0.77 | 50.41 | 0.939 | 0.911 | 0.030 | 0.984 |
| | 550 | 24.24 | 24.80 | 0.95 | 50.01 | 0.977 | 0.941 | 0.037 | 1.000 |
| (j) In—Se/Ga—Se/In—Cu—Se | 420 | 22.44 | 26.43 | 0.33 | 50.79 | 0.849 | 0.839 | 0.012 | 0.969 |
| | 500 | 22.67 | 26.06 | 0.39 | 50.88 | 0.870 | 0.857 | 0.015 | 0.965 |
| | 550 | 23.42 | 25.17 | 0.86 | 50.55 | 0.930 | 0.900 | 0.033 | 0.978 |
| (k) In—Se/Ga—Se/Cu—Se/In—Se | 420 | 22.39 | 26.17 | 0.35 | 51.09 | 0.856 | 0.844 | 0.013 | 0.957 |
| | 500 | 21.51 | 26.69 | 0.47 | 51.33 | 0.806 | 0.792 | 0.017 | 0.948 |
| | 550 | 22.82 | 25.72 | 0.73 | 50.73 | 0.887 | 0.863 | 0.028 | 0.971 |
| (l) In—Se/Ga—Se/In—Se/Cu—Se | 420 | 22.26 | 25.77 | 0.86 | 51.11 | 0.864 | 0.836 | 0.032 | 0.957 |
| | 500 | 24.65 | 21.75 | 3.63 | 49.97 | 1.133 | 0.971 | 0.143 | 1.001 |
| | 550 | 24.42 | 21.31 | 4.31 | 49.96 | 1.146 | 0.953 | 0.168 | 1.002 |
| (m) Ga—Se/In—Se/Cu—Se | 420 | 21.78 | 26.20 | 0.78 | 51.24 | 0.831 | 0.807 | 0.029 | 0.952 |
| | 500 | 22.16 | 25.78 | 1.09 | 50.97 | 0.860 | 0.825 | 0.041 | 0.962 |
| | 550 | 23.52 | 20.03 | 5.93 | 50.52 | 1.174 | 0.906 | 0.228 | 0.979 |

TABLE 8

Device performance of CIGS devices

| Precursor | Selenization | | | | Device parameters | | | |
|---|---|---|---|---|---|---|---|---|
| | T (° C.) | t (min) | Heat rate (° C./min.) | Se rate (Å/s) | $V_{oc}$ (mV) | $J_{sc}$ (mA/cm$^2$) | FF (%) | η (%) |
| (i) In—Se/Ga—Se/Cu—Se | 420 | 20 | 300 | 30 | 460 | 34.53 | 71.69 | 11.38 |
| | 500 | | | | 419 | 33.77 | 66.88 | 9.46 |
| | 550 | | | | 418 | 33.70 | 68.51 | 9.66 |
| (j) In—Se/Ga—Se/In—Cu—Se | 420 | 20 | 300 | 30 | 430 | 30.01 | 69.52 | 8.97 |
| | 500 | | | | 384 | 31.93 | 68.16 | 8.00 |
| | 550 | | | | 416 | 29.52 | 65.71 | 8.07 |
| (k) In—Se/Ga—Se/Cu—Se/In—Se | 420 | 20 | 300 | 30 | 436 | 29.73 | 66.94 | 8.67 |
| | 500 | | | | 407 | 30.16 | 68.12 | 8.36 |
| | 550 | | | | 421 | 30.95 | 66.28 | 8.63 |
| (l) In—Se/Ga—Se/In—Se/Cu—Se | 420 | 20 | 300 | 30 | 408 | 31.84 | 67.99 | 8.83 |
| | 500 | | | | 409 | 34.35 | 62.65 | 8.80 |
| | 550 | | | | 459 | 33.59 | 65.15 | 10.04 |
| (m) Ga—Se/In—Se/Cu—Se | 420 | 20 | 300 | 30 | 398 | 32.74 | 68.94 | 8.99 |
| | 500 | | | | 419 | 33.51 | 69.02 | 9.68 |
| | 550 | | | | 537 | 31.34 | 70.00 | 11.78 |

TABLE 9

| Reaction No. | Reaction | PB-ratio |
|---|---|---|
| 1 | Cu + Se → CuSe | 1.012 |
| 2 | 2Cu + Se → Cu$_2$Se | 1.984 |
| 3 | Cu + 2Se → CuSe$_2$ | 0.863 |
| 4 | Ga + Se → GaSe | 1.048 |
| 5 | 2Ga + 3Se → Ga$_2$Se$_3$ | 1.050 |
| 6 | In + Se → InSe | 1.096 |
| 7 | 2In + 3Se → In$_2$Se$_3$ | 0.997 |
| 8 | Cu + Ga + 2Se → CuGaSe$_2$ | 1.011 |
| 9 | Cu + In + 2Se → CuInSe$_2$ | 1.051 |
| 10 | Cu + 0.7In + 0.3Ga + 2Se → CuIn$_{0.7}$Ga$_{0.3}$Se$_2$ | 1.041 |

The embodiments of the invention in which an exclusive property or privilege is claimed are defined as follows:

1. A method of fabricating a group IB-IIIA-VIA polycrystalline semiconductor material, comprising:

a) determining a desired ratio of group IB atoms to group IIIA atoms for the polycrystalline semiconductor material;

b) depositing a layered amorphous precursor onto an unheated or actively cooled substrate by:
  (i) depositing a first amorphous precursor layer on the substrate with a flux of the group IIIA atoms and a flux of the VIA atoms and essentially no flux of group IB atoms, to produce an amorphous layer of group IIIA atoms and group VIA atoms in substantially equal atomic percent to each other; and
  (ii) depositing a second amorphous precursor layer on the first amorphous precursor layer with a flux of the group IB atoms and a flux of the VIA atoms and essentially no flux of group IIIA atoms, to produce an amorphous layer of group IB atoms and group VIA atoms in substantially equal atomic percent to each other;

wherein the ratio of group IB atoms in the second amorphous precursor layer to the group IIIA atoms in the first amorphous precursor layer is substantially equal to the desired ratio of group IB atoms to group IIIA atoms for the semiconductor material, while maintaining a ratio substantially of one group VIA atom for every atom from group IIIA or group IB in the layered amorphous precursor; and c) annealing the layered amorphous precursor and substrate at an elevated temperature above room temperature and then cooling to recrystallize the group IB, group IIIA, and group VIA atoms to produce the polycrystalline semiconductor material.

2. The method of claim 1, including maintaining an overpressure of group VIA vapor during annealing to inhibit evaporation of group VIA atoms from the amorphous layered precursor during annealing.

3. The method of claim 1, wherein said substrate is selected from the group consisting of glass, metal, high temperature plastic, ceramic, and silicon.

4. The method of claim 1, wherein the substrate comprises glass coated on a major surface with a metal, and wherein the first amorphous precursor layer is deposited onto the metal-coated surface of the substrate.

5. The method of claim 1, wherein the stoichiometry of the polycrystalline semiconductor material after said cooling is substantially the same as the stoichiometry of the layered amorphous precursor prior to said annealing.

6. The method of claim 1, wherein the thickness of the polycrystalline semiconductor material after said cooling is substantially the same as the thickness of the layered amorphous precursor prior to said annealing.

7. A method of fabricating a group IB-IIIA-VIA polycrystalline semiconductor material, comprising:
  a) determining a desired ratio of group IB metal atomic species to group IIIA metal atomic species for the polycrystalline semiconductor material;
  b) depositing a layered amorphous precursor onto an unheated or actively cooled substrate by sequentially depositing a plurality of individual amorphous precursor layers, the individual precursor layers formed by providing a flux of either i) one or more of the desired group IB metal atomic species, or ii) one or more of the desired group IIIA metal atomic species, but not both i) and ii); and with said flux of group IB or IIIA metal atomic species accompanied by a flux of group VIA nonmetal atomic species;
  wherein the layered amorphous precursor includes group IB metal atomic species and group IIIA metal atomic species along with about 40–70 atomic percent of the group VIA nonmetal atomic species, and, further, with group IB metal atomic species and group IIIA metal atomic species proportioned in relation to each other to provide said desired ratio of group IB metal atomic species to group IIIA metal atomic species; and
  c) annealing the layered amorphous precursor on the substrate at an elevated temperature above room temperature and then cooling to recrystallize the group IB, group IIIA, and group VIA atomic species to produce the polycrystalline semiconductor material.

8. The method of claim 7, wherein each of said amorphous precursor layers are deposited by a hybrid sputtering and evaporation method.

9. The method of claim 7, wherein said precursor is deposited by providing a total group IIIA flux comprising one or more group IIIA metals while evaporating said group VIA metal at a first group VIA flux to deposit a group IIIA-VIA layer onto said unheated substrate; and then providing a total group IB flux comprising one or more group IB metals while evaporating said group VIA element at a second group VIA flux to deposit a group IB-VIA layer onto said group IIIA-VIA layer.

10. The method of claim 7, wherein the percentage of said group VIA nonmetal atomic species in said precursor is about 50 atomic percent.

11. The method of claim 7, wherein said elevated temperature is in a range of about 420° C.–550° C.

12. The method of claim 7, including heating said precursor up to said elevated temperature at a rate of about 300° C./min.

13. The method of claim 7, including providing a vapor overpressure of said group VIA element during said heating.

14. The method of claim 7, wherein said semiconductor material is $CuIn_{1-x}Ga_xSe_2$, $0 \leq x \leq 1$.

15. The method of claim 7, wherein said substrate is selected from the group consisting of glass, metal, high temperature plastic, ceramic, and silicon.

16. The method of claim 7, wherein no overpressure of said group VIA element is present during annealing.

17. The method of claim 7, wherein the stoichiometry of the polycrystalline semiconductor material after said cooling is substantially the same as the stoichiometry of the layered amorphous precursor prior to said annealing.

18. The method of claim 7, wherein the thickness of the polycrystalline semiconductor material after said cooling is substantially the same as the thickness of the layered amorphous precursor prior to said annealing.

19. The method of claim 7, wherein said elevated temperature is about 420° C.

20. The method of claim 7, wherein said elevated temperature is about 550° C.

21. A method of fabricating a polycrystalline $CuInSe_2$ semiconductor material, comprising:
  determining a desired ratio of Cu to In for the polycrystalline $CuInSe_2$ semiconductor material;
  depositing a layered amorphous precursor onto an unheated or actively cooled substrate by sequentially depositing by means of atomic flux a plurality of individual amorphous precursor layers with:
    (i) a flux for at least one of the individual precursor layers comprising Cu accompanied by a flux of Se and substantially no flux of In, to produce an amorphous Cu-Se layer, with the Se constituting 40–70 atomic percent of this individual precursor layer,
    (ii) a flux for at least another of the individual precursor layers comprising In accompanied by a flux of Se and substantially no flux of Cu, to produce an amorphous In-Se layer, with the Se constituting 40–70 atomic percent of this individual precursor layer, and
    (iii) further, depositing enough of the Cu and In in the respective individual precursor layers to make the layered amorphous precursor include the desired ratio of Cu to In; and
  annealing the layered amorphous precursor on the substrate at an elevated temperature above room temperature and then cooling to recrystallize the Cu, In, and Se to produce the polycrystalline $CuInSe_2$ semiconductor material.

22. The method of claim 21, including heating said precursor up to said elevated temperature at a rate of 300° C./minute.

23. The method of claim 21, wherein said Cu-Se layer is deposited by sputtering from a Cu target to provide a Cu flux while simultaneously evaporating Se to provide a Se flux.

24. The method of claim 21, wherein said In-Se layer is deposited by sputtering from an In target to provide an In flux while simultaneously evaporating Se to provide a Se flux.

25. The method of claim 21, wherein the percentage of Se in said precursor is about 50 atomic percent.

26. The method of claim 21, wherein said substrate is selected from the group consisting of glass, metal, high temperature plastic, ceramic, and silicon.

27. The method of claim 21, including maintaining a Se vapor over pressure during the annealing to inhibit evaporation of Se from the precursor.

28. The method of claim 21, wherein no overpressure of Se vapor is present during annealing.

29. The method of claim 21, wherein the stoichiometry of the polycrystailine semiconductor material after said cooling is substantially the same as the stoichiometry of the layered amorphous precursor prior to said annealing.

* * * * *